(12) United States Patent
Nagase

(10) Patent No.: US 7,141,358 B2
(45) Date of Patent: Nov. 28, 2006

(54) IMAGE-FORMING METHOD AND DEVELOPER

(75) Inventor: Hiroyuki Nagase, Haibara-Gun (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 10/902,139

(22) Filed: Jul. 30, 2004

(65) Prior Publication Data

US 2005/0026092 A1    Feb. 3, 2005

(30) Foreign Application Priority Data

Jul. 31, 2003    (JP) ............................. 2003-204979

(51) Int. Cl.
*G03F 7/30*    (2006.01)
*G03F 7/32*    (2006.01)

(52) U.S. Cl. ...................... 430/331; 430/302
(58) Field of Classification Search ................ 430/331, 430/302
See application file for complete search history.

(56) References Cited

U.S. PATENT DOCUMENTS

| 4,188,215 A | * | 2/1980 | Sato et al. ................... 430/156 |
| 5,837,425 A | * | 11/1998 | Nakanishi et al. .......... 430/302 |
| 5,897,985 A |   | 4/1999 | Miller et al. |
| 6,759,177 B1 | * | 7/2004 | Shimada et al. .......... 430/270.1 |

FOREIGN PATENT DOCUMENTS

| EP | 0 466 071 A2 |   | 1/1992 |
| EP | 1 110 747 A1 |   | 6/2001 |
| EP | 1 253 472 A2 |   | 10/2002 |
| JP | 62-32453 | * | 2/1987 |
| JP | 05088377 A |   | 4/1993 |
| JP | 08108621 A |   | 4/1996 |
| JP | 10239858 A |   | 9/1998 |
| JP | 11065126 A |   | 3/1999 |

OTHER PUBLICATIONS

Abstract of JP 62-32453.*

* cited by examiner

*Primary Examiner*—Hoa Van Le
(74) *Attorney, Agent, or Firm*—Buchanan Ingersoll & Rooney PC

(57) ABSTRACT

A developer comprising at least one carbonate, at least one hydrogen carbonate and at least one alkali silicate, wherein the ratio of the total molar concentration "a" of the carbonate and the hydrogen carbonate to the molar concentration "b" of the $SiO_2$ component present in the alkali silicate: "a/b" ranges from 1:0.3 to 1:2, the total molar concentration of "a" and "b": "a+b" ranges from 0.1 to 2 mole/L, and the pH value thereof ranges from 9 to 13; and an image-forming method which comprises the steps of imagewise exposing a negative-working image-forming material which comprises a substrate provided thereon with an image-recording layer comprising an infrared light absorber, a polymerization initiator, an ethylenically unsaturated bond-containing monomer and a polymer binder, and then developing the imagewise exposed image-forming material with the foregoing developer.

9 Claims, 1 Drawing Sheet

IMAGE-FORMING METHOD AND DEVELOPER

BACKGROUND OF THE INVENTION

The present invention relates to a developer to be applied to an image-forming material and a method for forming images and more specifically to a developer effective for a negative-working image-forming material which can directly be converted into a printing plate by scanning the same with an infrared laser rays on the basis of digital signals outputted from, for instance, a computer or which can be applied to the so-called direct plate-making process as well as an image-forming method which makes use of the foregoing developer.

Considerable progress has recently been made in the laser technology and, in particular, a high power, small-sized laser capable of emitting light rays having a wavelength falling within the range of from near infrared to infrared has easily commercially been available. These lasers are quite useful as light sources for recording used when a printing plate is directly prepared on the basis of digital signals outputted from, for instance, a computer (Computer to Plate: hereunder sometimes referred to as "CTP"). For instance, a solid state laser and a semiconductor laser emitting infrared rays whose wavelengths fall within the range of from 760 to 1200 nm are quite useful because of their high power as compared with other lasers emitting light rays having wavelengths beyond the foregoing range. For this reason, there has recently been an increased demand for an image-forming material quite sensitive to such a laser or an image-forming material whose solubility in a developer would greatly be changed through the irradiation thereof with the laser light rays.

There has been proposed, as such an image-forming material, those which make the most use of a radical addition-polymerization reaction. The material is in general imagewise exposed to laser light rays and then developed with an alkaline aqueous solution to thus give desired images. In this respect, there have been proposed two kinds of developing methods or a method comprising the steps of heat-treating the imagewise exposed material and then developing the same and a method comprising the step of developing the imagewise exposed material immediately after the imagewise exposure without carrying out any heat-treatment. The former suffers from a problem in that it requires the use of a large-sized installation and that the production cost increases since an automatic developing machine to be used must be equipped with an oven for heating. On the other hand, the latter likewise suffers from a problem in that the radical polymerization of the material through the exposure is not sufficiently accelerated, the exposed area is insufficient in the degree of curing and therefore, the printing durability of the resulting printing plate is low as compared with that observed for the printing plate prepared according to the former method. However, there has been desired for the development of an effective plate-making or developing method free of any heat-treatment since it is quite advantageous for users to omit the use of any oven for heating in the plate-making method.

In order to impart satisfactory printing durability to the resulting printing plat using a non-heating plate-making process, it is desirable that damages of image areas during the step for developing the same should be reduced as low as possible. However, it has been reported that the development of, for instance, a negative-working image-forming material comprising a photopolymerizable composition requires the use of a strongly alkaline aqueous solution having a pH value of higher than 12.5 (Japanese Un-Examined Patent Publication (hereunder referred to as "J.P. KOKAI") Hei 8-108621) and the use of a developer having such a high pH value arises a problem such that the image area is greatly damaged and the resulting printing plate has insufficient printing durability. Moreover, if such developing treatment is continued over a long period of time, problems arise such that the activity of the developer may undergo a variation in, for instance, the concentration of absorbed carbon dioxide due to changes of environmental conditions such as the carbon dioxide concentration and that the quality of the resulting printing plate may correspondingly be changed due to the influence of such an increase in the carbon dioxide concentration.

To solve the foregoing problem or to control any reduction of the developing ability of a developer due to any change with time or aging and/or repeated use of the same, there has been proposed a method for developing a layer comprising a light-sensitive resin composition formed on the surface of a glass substrate with a mixed aqueous solution containing sodium carbonate and sodium hydrogen carbonate having a pH value of about 10 (see, for instance, J.P. KOKAI Hei 5-88377, J.P. KOKAI Hei 11-65126). However, the inventors of this invention applied these developers to a light-sensitive lithographic printing plate comprising an aluminum substrate provided thereon with a light-sensitive layer which comprises a thermally polymerizable light-sensitive resin composition and as a result, they found that the developers never showed any satisfactory ability of developing the non-image area thereof.

There has also been reported an alkaline developer to which an alkyl phenol type surfactant is added for solving the problem concerning the developing ability of a photoresist comprising a pigment dispersed therein (see J.P. KOKAI Hei 10-239858), but there have not yet been developed any developer having a sufficient developing ability and capable of providing a printing plate having sufficient printing durability.

SUMMARY OF THE INVENTION

It is an object of the present invention to provide a developer and an image-forming method which permit the formation of images excellent in printing durability, without using any heat-treatment after the exposure of an image-forming material, which are excellent in the developing ability and the resolving power, which hardly cause any reduction of the developing properties with time originated from the characteristic properties of the developer used and which have a wide latitude and never change the quality of light-sensitive materials to be treated irrespective of any pH change.

It is also an object of the present invention to provide a developer and a method for forming images from a negative-working image-forming material on which images are recorded using an infrared laser, which can ensure a satisfactory resolving power and permits the formation of a printing plate having sufficient strength of images, without using any heat-treatment of a printing plate precursor after the imagewise exposure.

The inventors of this invention have conducted various studies, while taking notice of the developer, have found that when incorporating an alkaline silicate, at a specific rate, into a developer containing a carbonate and a hydrogen carbonate, the quality of the image-forming material has a wide latitude and is stable irrespective of any pH change, that the sufficient developing ability and resistance to stain can be ensured and that the incorporation of such a silicate permits the inhibition of any dissolution of a substrate such as an aluminum substrate during development, and have thus achieved the foregoing object and have thus completed the present invention.

Accordingly, the present invention relates to a developer comprising at least one carbonate, at least one hydrogen carbonate and at least one alkali silicate, wherein the ratio of the total molar concentration "a" of the carbonate and the hydrogen carbonate to the molar concentration "b" of the $SiO_2$ component present in the alkali silicate: "a/b" ranges from 1:0.3 to 1:2, the total molar concentration of "a" and "b": "a+b" ranges from 0.1 to 2 mole/L, and the pH value thereof ranges from 9 to 13; and an image-forming method comprising the steps of imagewise exposing a negative-working image-forming material which comprises a substrate provided thereon with an image-recording layer comprising an infrared light absorber, a polymerization initiator, an ethylenically unsaturated bond-containing monomer and a polymer binder, and then developing the imagewise exposed image-forming material with a developer comprising at least one carbonate, at least one hydrogen carbonate and at least one alkali silicate, wherein the ratio of the total molar concentration "a" of the carbonate and the hydrogen carbonate to the molar concentration "b" of the $SiO_2$ component present in the alkali silicate: "a/b" ranges from 1:0.3 to 1:2, the total molar concentration of "a" and "b": "a+b" ranges from 0.1 to 2 mole/L, and the pH value thereof ranges from 9 to 13.

It has been found that the foregoing developer is excellent in the developing properties even at a relatively low pH range wherein the developer is less susceptible to carbon dioxide, that it can reduce damages of image areas to thus improve the printing durability of the resulting printing plate and that it can further reduce any variation of the quality of plate materials possibly encountered when the pH of the developer is fluctuated. Therefore, the developer of the invention would ensure a stable processing ability even in the treatment of an image-forming material having a low quality latitude during development (or low discrimination).

BEST MODE FOR CARRYING OUT THE INVENTION

Figure 1:
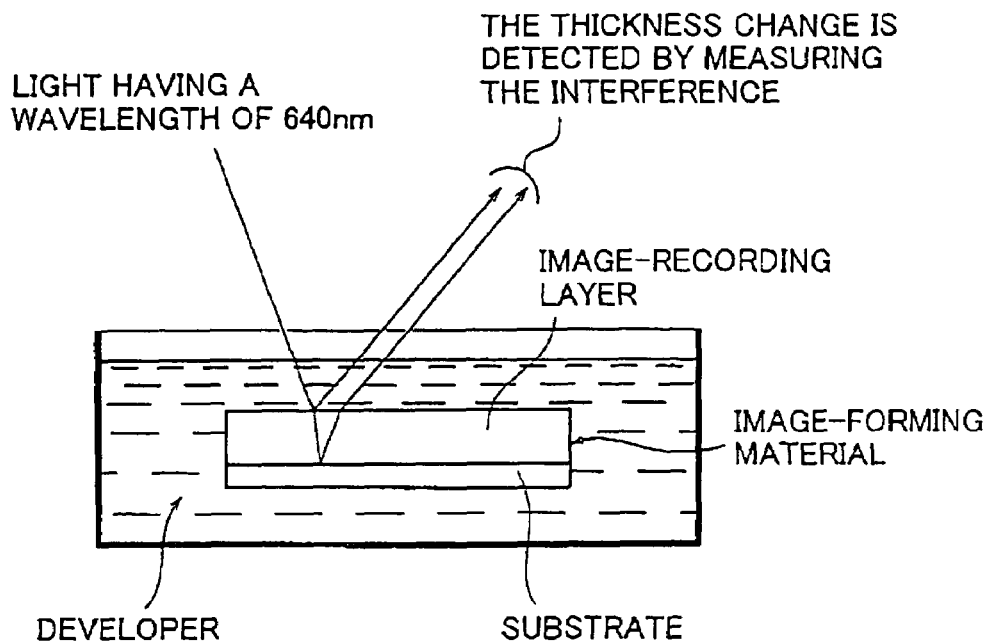
FIG. 1 is a schematic diagram for illustrating an example of the DRM Interference Spectrophotometer for determining the dissolution behaviors of an image-recording layer.

The developer and image-forming method according to the present invention will hereunder be described in more detail.

First of all, the developer of the invention will be described below in detail.

[Developer]

(Carbonate and Hydrogen Carbonate)

The developer of the invention comprises at least one carbonate, at least one hydrogen carbonate and at least one alkali metal silicate at a rate specified below; and has a pH value ranging from 9.0 to 13.0. Further, the pH value preferably ranges from 9.0 to 12.5.

The foregoing at least one carbonate and at least one hydrogen carbonate serve as alkaline agents in the developer. The carbonate may be at least one compound selected from carbonates of inorganic alkalis. Specific examples thereof are sodium carbonate, potassium carbonate and ammonium carbonate. The hydrogen carbonate may be, for instance, at least one compound selected from hydrogen carbonates of inorganic alkalis. Specific examples thereof are sodium hydrogen carbonate, potassium hydrogen carbonate and ammonium hydrogen carbonate. It is preferred that the amounts of the carbonate and the hydrogen carbonate in the developer be adjusted to the range of from 0.005 to 1 mole/L and 0.001 to 1 mole/L respectively, since the desired pH buffering effect can be obtained within the pH range of from 8.5 to 11.0 and the amount of carbon dioxide absorbed by the developer can be reduced.

(Alkali Silicates)

The developer of the invention further comprises at least one alkali metal silicate in addition to the foregoing carbonate and hydrogen carbonate.

The alkali silicate used in the invention is a substance showing alkaline properties when it is dissolved in water and examples thereof are sodium silicate, potassium silicate, lithium silicate and ammonium silicate. These alkali metal silicates may be used alone or in any combination of at least two of them.

The properties of the developer of the invention can easily be controlled to optimum ranges by appropriately adjusting the mixing ratio of the silicon oxide $SiO_2$ as the component of the silicate as the component for the hydrophilization of a substrate to the alkali oxide $M_2O$ (M represents an alkali metal or ammonium group) as the alkali component and the concentrations thereof. In the developer, the mixing ratio of silicon oxide $SiO_2$ to alkali oxide $M_2O$ (molar ratio: $SiO_2/M_2O$) ranges from 0.75 to 4.0 and preferably 0.75 to 3.5.

If the ratio: $SiO_2/M_2O$ is less than 0.75, the alkalinity of the resulting developer is too high, the anodized layer of the aluminum substrate as a substrate for a lithographic printing plate precursor is excessively dissolved (or etched), the developer causes staining of a precursor upon allowing it to stand and insoluble scum may be formed due to the formation of a complex between dissolved aluminum and silicic acid. On the other hand, if the ratio exceeds 4.0 or even 3.0, various problems arise such that the developing ability of the resulting developer may be reduced and that insoluble scum may be formed through condensation of silicates.

The concentration of the alkali silicate in the developer preferably ranges from 0.01 to 1 mole/L and more preferably 0.05 to 0.8 mole/L as expressed in terms of the amount of $SiO_2$ on the basis of the total mass of the alkaline aqueous solution. If the concentration is less than 0.01 mole/L, the resulting developer never shows the desired effect of inhibiting the dissolution (or etching) of the anodized layer on the aluminum substrate cannot be obtained and the developing properties and development processing ability thereof are sometimes deteriorated, while if it exceeds 1 mole/L, the resulting developer is quite susceptible to the generation of precipitates and/or crystals and it easily undergoes gelation when it is neutralized for abandonment and this in turn becomes a cause of various troubles encountered in the waste disposal.

In this respect, the inventors have found that any variation in the quality of the plate material encountered when the pH value of the developer undergoes a change can be reduced by the addition of an alkali silicate to the developer in such a manner that the ratio "a/b" of the total molar concentration "a" to the molar concentration "b" of the $SiO_2$ component in the alkali metal silicate falls within the range of from 1:0.3 to 1:2 and that the total molar concentration of "a" and "b": "a+b" ranges from 0.1 to 2 mole/L. For this reason, the developer of the invention would ensure a stable processing ability even in the treatment of an image-forming material having a low quality latitude during development (or low discrimination). The ratio "a/b" preferably ranges from 1:0.5 to 1:1.5 and the total molar concentration "a+b" preferably ranges from 0.2 to 1.5 mole/L.

The developer may be one prepared by dissolving all of the components in a single solution or by admixing separate aqueous solutions of these components, for instance, three separate aqueous solutions containing a carbonate, a hydrogen carbonate and a silicate respectively.

The developer may further comprise, as an alkaline agent, an inorganic alkaline agent such as sodium tertiary phosphate, potassium tertiary phosphate, ammonium tertiary phosphate, sodium borate, potassium borate, ammonium borate, sodium hydroxide, potassium hydroxide, ammonium hydroxide or lithium hydroxide; and an organic alkaline agent such as mono-methylamine, di-methylamine, tri-methylamine, mono-ethylamine, di-ethylamine, tri-ethylamine, mono-isopropylamine, di-isopropyl-amine, tri-isopropylamine, n-butylamine, mono-ethanolamine, di-ethanolamine, tri-ethanolamine, mono-isopropanolamine, di-isopropanolamine, ethylene-imine, ethylene-diamine, pyridine or tetramethyl ammonium hydroxide. These alkaline agents may be used alone or in any combination of at least two of them.

(Surfactant)

Further, the developer of the present invention preferably comprises at least one surfactant selected from the group consisting of anionic surfactants and nonionic surfactants. The addition of such a surfactant would permit the improvement of the developing ability of the resulting developer and the improvement of the dispersing quality of components of an image-recording composition dissolved in the developer to thus inhibit the formation of, for instance, precipitates in the developer. These surfactants are preferably added to the developer in an amount ranging from 1 to 10% by mass on the basis of the mass of the developer.

(Anionic Surfactant)

The anionic surfactants usable herein are compounds each having at least one anionic group in the molecule. Such anionic groups may be, for instance, carbonate anions, sulfonate anions, anions derived from sulfonic acids, sulfate anions, sulfite anions, phosphate anions, anions derived from phosphorous acids, phosphonate anions and anions derived from phosphinic acids, with sulfonate anions or sulfate anions being preferably used. More specifically, the anionic surfactants are compounds each having at least one sulfonate or sulfate anion. Preferably, the anionic surfactants are compounds each having at least one anionic group of sulfonic acid or anionic group of sulfuric acid monoester. More preferably, the anionic surfactants are compounds each having at least one anionic group of sulfonic acid or anionic group of sulfuric acid monoester and at least one substituted or unsubstituted aromatic group.

As such compounds each having at least one anionic group of sulfonic acid or anionic group of sulfuric acid monoester, preferably used herein are compounds represented by the following general formula (I) or (II):

$$R_1SO_3^- \qquad (I);$$

$$R_2\text{---}O\text{---}SO_3^- \qquad (II)$$

In these formulas, each of $R_1$ and $R_2$ represents a substituted or unsubstituted alkyl, cycloalkyl, alkenyl, aralkyl or aryl group. The alkyl group may be, for instance, one having 1 to 20 carbon atoms and preferred examples thereof are methyl, ethyl, propyl, n-butyl, se-butyl, hexyl, 2-ethylhexyl, octyl, decyl, dodecyl, hexadecyl and stearyl group.

The cycloalkyl group may be a monocyclic or polycyclic one. The monocyclic cycloalkyl group may be, for instance, one having 3 to 8 carbon atoms and preferred examples thereof are cyclopropyl, cyclopentyl, cyclohexyl and cyclooctyl groups. Examples of the polycyclic cycloalkyl groups preferably used herein are adamantyl, norbornyl, isobornyl, camphanyl, di-cyclopentyl, α-pinel and tricyclodecanyl groups.

The alkenyl group may be, for instance, one having 2 to 20 carbon atoms and specific examples thereof preferably used herein are vinyl, ally, butenyl and cyclohexenyl groups.

The aralkyl group may be, for instance, one having 7 to 12 carbon atoms and specific examples thereof preferably used herein include benzyl, phenethyl and naphthyl-methyl groups.

The aryl group may be, for instance, one having 6 to 15 carbon atoms and specific examples thereof preferably used herein include phenyl, tolyl, dimethyl-phenyl, 2,4,6-trimethylphenyl, naphthyl, anthryl and 9,10-dimethoxy-anthryl groups.

Moreover, the substituents usable herein are monovalent non-metallic atomic groups other than hydrogen atom and preferred examples thereof are halogen atoms (such as F, Br, Cl, I), a hydroxyl group, alkoxy groups, aryloxy groups, acyl groups, amide groups, ester groups, acyloxy groups, carboxyl groups, carboxylate anions or sulfonate anions.

Specific examples of the alkoxy groups as such substituents are those having 1 to 40, preferably 1 to 20 carbon atoms such as methoxy, ethoxy, propoxy, iso-propoxy, butoxy, pentyloxy, hexyloxy, dodecyloxy, stearyloxy, methoxy-ethoxy, poly(ethyleneoxy) and poly(propyleneoxy) groups. Examples of the aryloxy groups are those having 6 to 18 carbon atoms such as phenoxy, tolyloxy, xylyl-oxy, mesityl-oxy, cumenyl-oxy, methoxy-phenyloxy, ethoxy-phenyloxy, chloro-phenyloxy, bromo-phenyloxy and naphthyl-oxy groups. Examples of the acyl groups are those having 2 to 24 carbon atoms such as acetyl, propanoyl, butanoyl, benzoyl and naphthoyl groups. Examples of the amide groups are those having 2 to 24 carbon atoms such as acetamide, propionamide, dodecanoic acid amide, palmitic acid amide, stearic acid amide, benzoic acid amide and naphthoic acid amide groups. Examples of the acyloxy groups are those having 2 to 20 carbon atoms such as acetoxy, propanoyl-oxy, benzoyl-oxy and naphthoyl-oxy groups. Examples of the ester groups are those having 1 to 24 carbon atoms such as methyl ester, ethyl ester, propyl ester, hexyl ester, octyl ester, dodecyl ester and stearyl ester groups. The substituent may be any combination of at least two of the foregoing ones.

Among the compounds represented by Formula (I) or (II), preferably used herein include compounds represented by the following formulas (I-A) and (I-B) while taking into consideration the effects of the present invention:

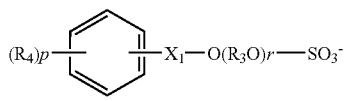
(I-A)

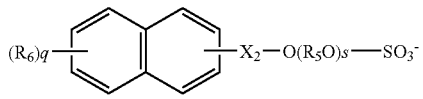
(I-B)

wherein, each of $R_3$ and $R_6$ represents a linear or branched alkylene group having 1 to 5 carbon atoms; each of $R_4$ and $R_6$ represents a linear or branched alkyl group having 1 to 20 carbon atoms; p and q represent 0, 1 or 2, respectively; $X_1$ and $X_2$ represent a single bond or an alkylene group having 1 to 10 carbon atoms, respectively; r and s are an integer ranging from 1 to 100, respectively, provided that if r and s are not less than 2, $R_3$ or $R_5$ may be selected from at least two kinds of groups.

Examples of the compounds represented by Formulas (I) and (II) will be given below, but the present invention is not restricted to these specific examples at all.

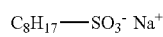 (I-1)

 (I-2)

 (I-3)

 (I-4)

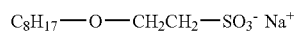 (I-5)

 (I-6)

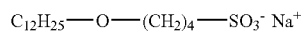 (I-7)

 (I-8)

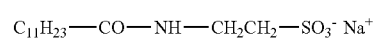 (I-9)

 (I-10)

 (I-11)

 (I-12)

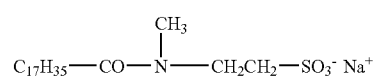 (I-13)

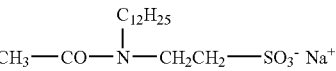 (I-14)

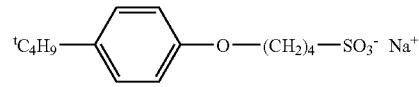 (I-15)

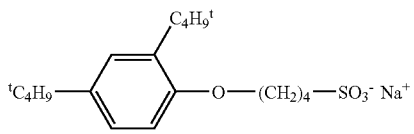 (I-16)

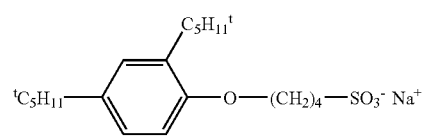 (I-17)

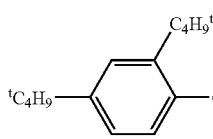 (I-18)

 (I-19)

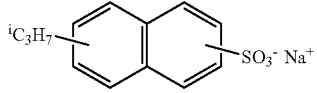 (I-20)

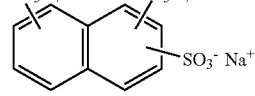 (I-21)

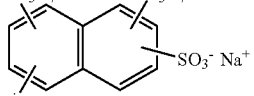 (I-22)

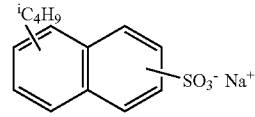 (I-23)

-continued

-continued
(I-45) 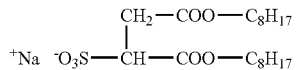
(I-46) 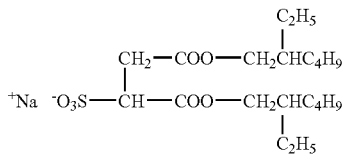
(I-47) 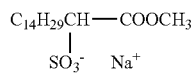
(I-48) 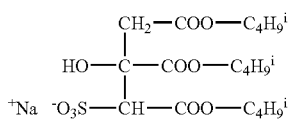
(I-49) 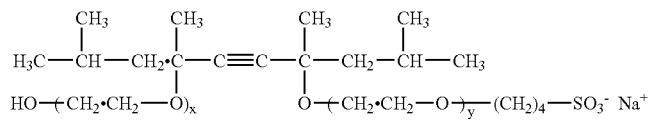
(I-50) 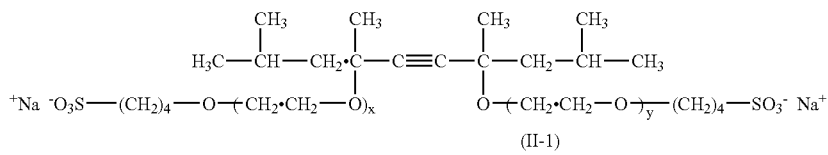
(II-1) 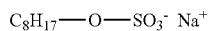
(II-2) 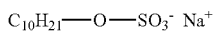
(II-3) 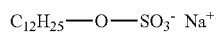
(II-4) 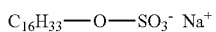
(II-5) 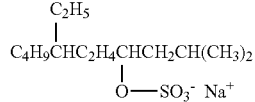
(II-6) 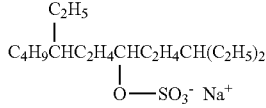
(II-7) 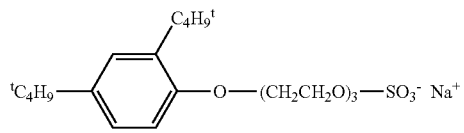
(II-8) 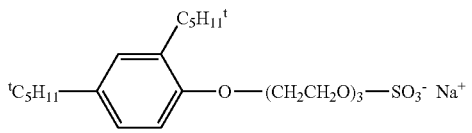
(II-9) 
(II-10) 
(II-11) 
(II-12) 
(II-13) 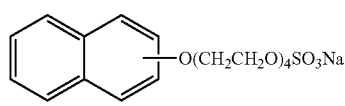
(II-14) 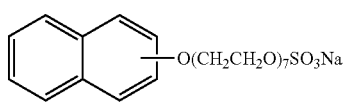
(II-15) 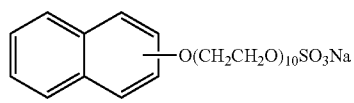
(II-16) 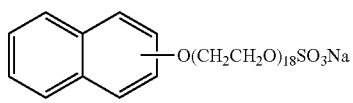
(II-17) 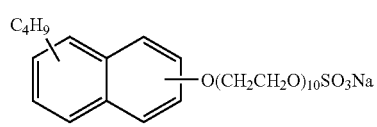
(II-18) 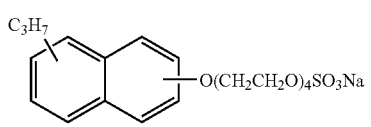

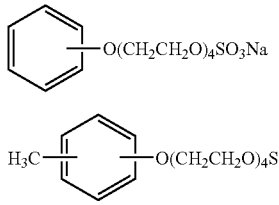

(II-19)

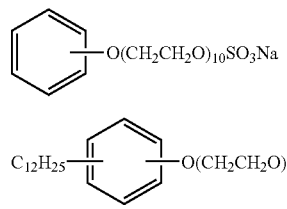

(II-20)

(II-21)

(II-22)

In the foregoing specific examples, x and y represent the numbers of repeating units or ethyleneoxy chains and propyleneoxy chains, respectively and they are integers each ranging from 1 to 20 (average values).

It is effective to add the compound represented by Formula (I) or (II) to the developer in an amount suitably ranging from 1 to 10% by mass and preferably 2 to 10% by mass on the basis of the total mass of the developer.

In this respect, if the added amount of the compound is too small, the resulting developer has a reduced developing ability and a low ability of solubilizing the components of the light-sensitive layer, while if it is too large, the resulting developer would reduce the printing durability of the printing plate ultimately prepared.

The compound represented by the general formula (I) or (II) may in general be commercially available. Examples of such compounds commercially available include those prepared and sold by a variety of manufacturers such as Asahi Denka Kogyo K.K.; Kao Corporation; Sanyo Chemical Industries, Ltd.; New Japan Chemical Co., Ltd.; Dai-Ichi Kogyo Seiyaku Co., Ltd.; Takemoto Oil and Fats Co., Ltd.; Toho Chemical Industry Co., Ltd.; and Nippon Oil and Fats Co., Ltd.

(Nonionic Aromatic Ether Type Surfactant)

The nonionic surfactants which can be added to the developer of the present invention may be, for instance, nonionic aromatic ether type surfactants represented by the following formula (1):

$$X—Y—O-(A)_n-(B)_m—H \quad (1)$$

wherein, X represents a substituted or unsubstituted aromatic group; Y represents a single bond or an alkylene group having 1 to 10 carbon atoms; A and B represent groups different from one another and each represents either $—CH_2CH_2O—$ or $—CH_2CH(CH_3)O—$; m and n are 0 or integers ranging from 1 to 100, respectively, provided that n and m cannot simultaneously represent 0 and that when either n or m is 0, n and m cannot represent 1.

In the foregoing general formula, the aromatic group represented by X may be, for instance, a phenyl group, a naphthyl group or an anthranyl group. These aromatic groups may have substituents. Such substituents may be, for instance, organic groups having 1 to 100 carbon atoms. Examples of such organic groups are the whole of organic groups described below in connection with the compounds represented by the following general formulas (1-A) and (1-B). In these formula, when A and B are simultaneously present, they may be in the form of random or block copolymers.

Specific examples of the compounds represented by the formula (1) are those represented by the following general formulas (1-A) and (1-B):

(1-A)

(1-B)

wherein, $R_{10}$ and $R_{20}$ represent a hydrogen atom or an organic group having 1 to 100 carbon atoms, respectively; t and u represent 1 or 2, respectively; $Y_1$ and $Y_2$ represent a single bond or an alkylene group having 1 to 10 carbon atoms, respectively; v and w are 0 or an integer ranging from 1 to 100, respectively, provided that v and w cannot simultaneously represent 0 and that when either v or w is 0, v and w cannot represent 1; and v' and w' are 0 or an integer ranging from 1 to 100, respectively, provided that v' and w' cannot simultaneously represent 0 and that when either v' or w' is 0, v' and w' cannot represent 1.

When t is 2 and $R_{10}$ represents an organic group having 1 to 100 carbon atoms, these groups $R_{10}$ may be the same or different or a plurality of $R_{10}$ groups may form a ring together and when u is 2 and $R_{20}$ represents an organic group having 1 to 100 carbon atoms, these groups $R_{20}$ may be the same or different or a plurality of $R_{20}$ groups may form a ring together.

Specific example of the foregoing organic groups having 1 to 100 carbon atoms include saturated or unsaturated, linear or branched aliphatic hydrocarbon groups and aromatic hydrocarbon groups such as alkyl groups, alkenyl groups, alkynyl groups, aryl groups and aralkyl groups, as well as alkoxy groups, aryloxy groups, N-alkylamino groups, N,N-di-alkylamino groups, N-arylamino groups, N,N-di-arylamino groups, N-alkyl-N-arylamino groups, acyloxy groups, carbamoyloxy groups, N-alkyl-carbamoyloxy groups, N-aryl-carbamoyloxy groups, N,N-di-alkyl-carbamoyloxy groups, N,N-di-aryl-carbamoyloxy groups, N-alkyl-N-aryl-carbamoyloxy groups, acylamino groups, N-alkyl-acylamino groups, N-aryl-acylamino groups, acyl groups, alkoxy-carbonylamino groups, alkoxy-carbonyl groups, aryloxy-carbonyl groups, carbamoyl groups, N-alkyl-carbamoyl groups, N,N-dialkyl-carbamoyl groups, N-aryl-carbamoyl groups, N,N-diaryl-carbamoyl groups, N-alkyl-N-aryl-carbamoyl groups, polyoxyalkylene chains and these organic groups to which polyoxyalkylene chains are bonded. The foregoing alkyl groups may be linear or branched ones.

Preferred $R_{10}$ and $R_{20}$ may be, for instance, a hydrogen atom, a linear or branched alkyl group having 1 to 10 carbon atoms, an alkoxy group having 1 to 10 carbon atoms, an alkoxycarbonyl group, an N-alkylamino group, an N,N-dialkylamino group, an N-alkyl-carbamoyl groups, an acyloxy or acylamino group, a polyoxyalkylene chain having about 5 to 20 repeating units, an aryl group having 6 to 20 carbon atoms and an aryl group carrying a polyoxyalkylene chain bonded thereto and having about 5 to 20 repeating units.

In the compounds represented by the general formulas (1-A) and (1-B), the polyoxyethylene chain preferably has 3 to 50 and more preferably 5 to 30 repeating units. The polyoxypropylene chain preferably has 0 to 10 and more preferably 0 to 5 repeating units. The polyoxyethylene moieties and the polyoxypropylene moieties may be in the form of a random or block copolymer.

Examples of the compounds represented by Formula (1-A) include polyoxyethylene phenyl ether, polyoxyethylene methyl-phenyl ether, polyoxyethylene octyl-phenyl ether and polyoxyethylene nonyl-phenyl ether.

Examples of the compounds represented by Formula (1-B) include polyoxy-ethylene naphthyl ether, polyoxyethylene methyl-naphthyl ether, polyoxyethylene octyl-naphthyl ether and polyoxyethylene nonyl-naphthyl ether.

In the developer, these nonionic aromatic ether type surfactants may be used alone or in any combination of at least two of them.

The developer has a content of the nonionic aromatic ether type surfactant suitably ranging from 1 to 20% by mass and more preferably 2 to 10% by mass on the basis of the mass of the developer. In this respect, if the added amount of the surfactant is too small, the resulting developer has a reduced developing ability and a low ability of solubilizing the components of the light-sensitive layer, while if it is too large, the resulting developer would reduce the printing durability of the printing plate thus obtained.

The following are specific examples of the nonionic aromatic ether type surfactants represented by Formula (1-A) or (1-B):

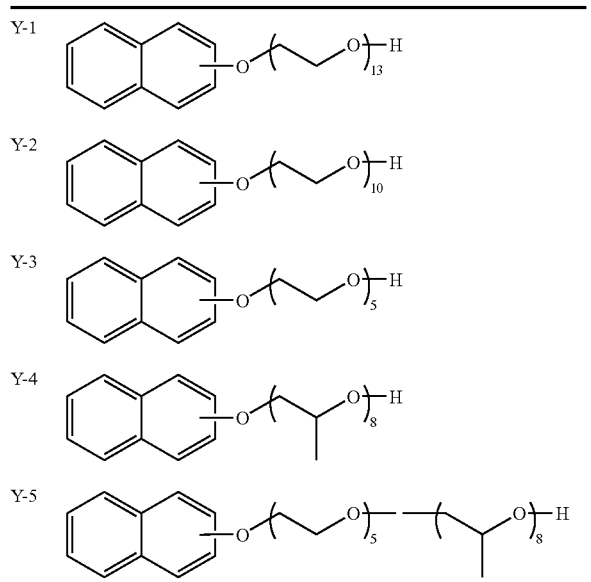

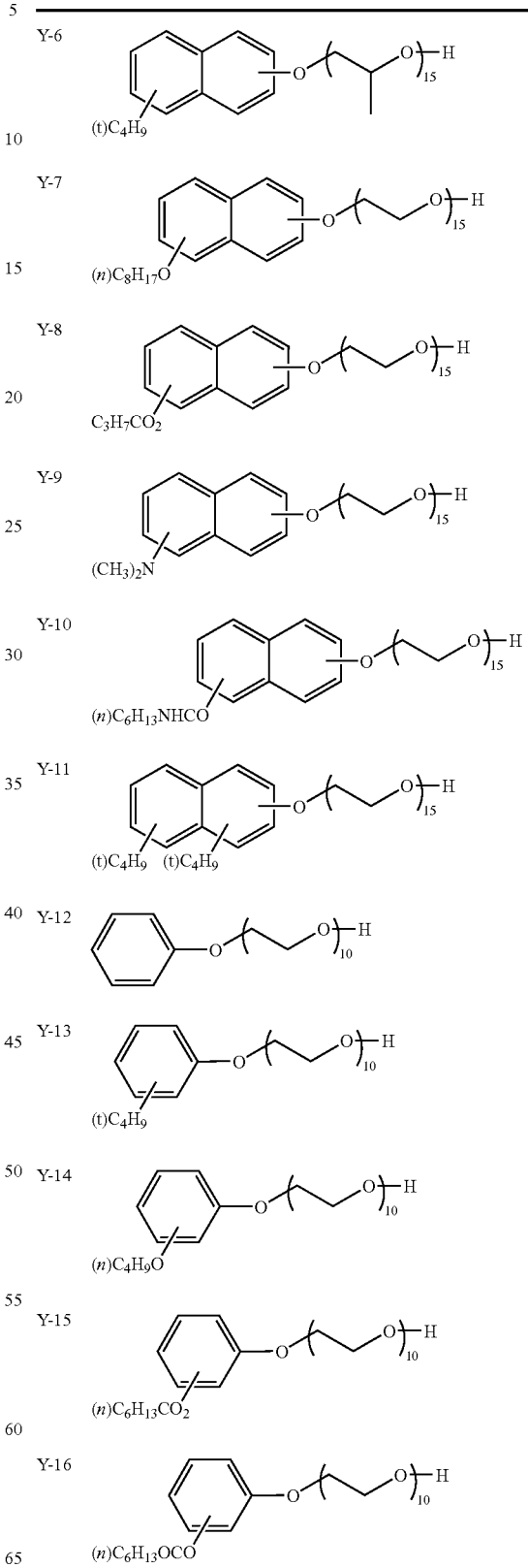

-continued

A—W

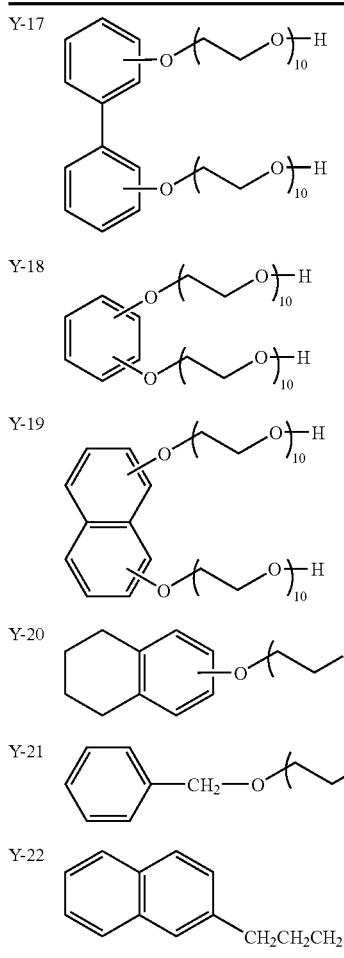

In addition, the developer used in the image-forming method of the invention may further comprise other surfactants such as those specified below.

Examples of other surfactants are nonionic surfactants, for instance, polyoxyethylene alkyl ethers such as polyoxyethylene lauryl ether, polyoxyethylene cetyl ether and polyoxyethylene stearyl ether, polyoxyethylene alkyl esters such as polyoxyethylene stearate, sorbitan alkyl esters such as sorbitan mono-laurate, sorbitan mono-stearate, sorbitan di-stearate, sorbitan mono-oleate, sorbitan sesqui-oleate and sorbitan tri-oleate, and mono-glyceride alkyl esters such as glycerol mono-stearate and glycerol mono-oleate.

These surfactants may be used alone or in any combination. Moreover, the content of these surfactants in the developer preferably ranges from 0.1 to 20% by mass as expressed in terms of the reduced amount of the effective component thereof.

(Anti-Foaming Agent)

The developer may likewise comprise an anti-foaming agent which is characterized in that it comprises acetylene alcohol and/or acetylene glycol. When adding such an anti-foaming agent to the developer, the amount thereof to be added preferably ranges from 0.01 to 1% by mass on the basis of the total mass of the developer.

The term "acetylene alcohol" herein used means an unsaturated alcohol having an acetylene bond (triple bond) in the molecule. In addition, the "acetylene glycol" is also referred to as "alkylene diol" and this term herein used means an unsaturated glycol having an acetylene bond (triple bond) in the molecule.

More specifically, examples of these anti-foaming agents include those represented by the following general formulas (A) and (B):

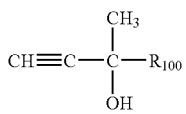

(A)

wherein, $R_{100}$ represents a linear or branched alkyl group having 1 to 5 carbon atoms.

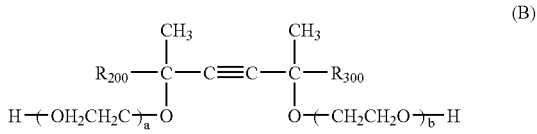

(B)

wherein, $R_{200}$ and $R_{300}$ independently represent a linear or branched alkyl group having 1 to 5 carbon atoms, respectively and a+b represents a numerical value ranging from 0 to 30.

Examples of the foregoing linear or branched alkyl groups each having 1 to 5 carbon atoms include methyl, ethyl, isopropyl, isobutyl and isopentyl groups.

Specific examples of acetylene alcohols and acetylene glycols further include those listed below:

(1) Propargyl Alcohol: CH≡C—CH$_2$OH
(2) Propargyl Carbinol: CH≡C—CH$_2$—CH$_2$OH
(3) 3,5-Di-methyl-1-hexyn-3-ol:

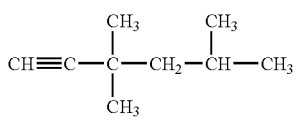

(4) 3-Methyl-1-butyn-3-ol:

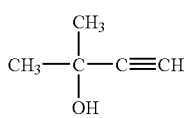

(5) 3-Methyl-1-pentyn-3-ol:

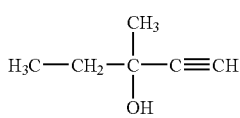

(6) 1,4-Butyne-diol: HO—CH$_2$—C≡C—CH$_2$—OH (7) 2,5-Di-methyl-3-hexyne-2,5-diol:

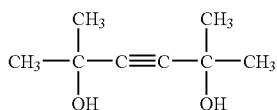

(8) 3,6-Di-methyl-4-octyne-3,6-diol:

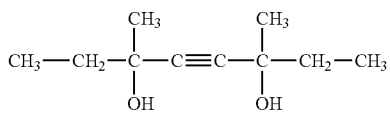

(9) 2,4,7,9,-Tetramethyl-5-decyne-4,7-diol:

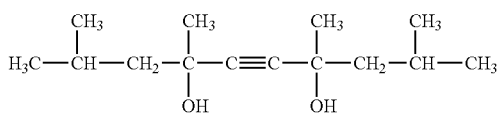

(10) Ethylene oxide adduct of 2,4,7,9,-tetramethyl-5-decyne-4,7-diol:

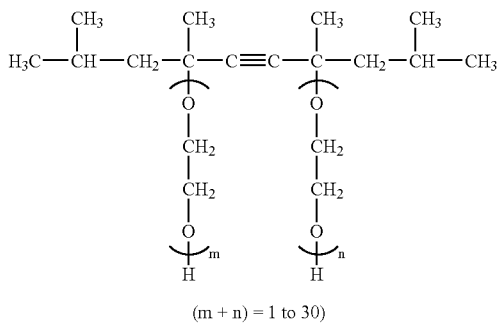

(m + n) = 1 to 30)

(11) 2,5,8,11-Tetra-methyl-6-dodecyne-5,8-diol:

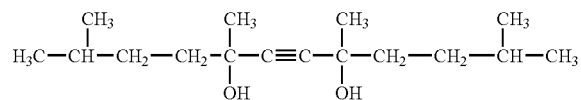

These acetylene alcohols and acetylene glycols may be commercially available and examples of such commercially available products are those available from Air Products and Chemicals Inc. under the trade name of SAFINOL. Specific examples thereof are SAFINOL 61 corresponding to the foregoing compound (3), ORPHYNE B corresponding to the foregoing compound (4), ORPHYNE P corresponding to the foregoing compound (5), ORPHYNE Y corresponding to the foregoing compound (7), SAFINOL 81 corresponding to the foregoing compound (8), SAFINOL 104 and ORPHYNE AK-02 corresponding to the foregoing compound (9), SAFINOL 400 series corresponding to the foregoing compounds (10), and SAFINOL DF-110 corresponding to the foregoing compound (11).

(Chelating Agent)

The developer may likewise comprise a chelating agent. Examples of such chelating agents are polyphosphoric acid salts such as Na$_2$P$_2$O$_7$, Na$_5$P$_3$O$_3$, Na$_3$P$_3$O$_9$, Na$_2$O$_4$P(NaO$_3$P) PO$_3$Na$_2$ and Calgon (sodium polymetaphosphate); aminopolycarboxylic acids such as ethylenediamine-tetraacetic acid and sodium and potassium salts thereof, diethylenetri-amine-pentaacetic acid and sodium and potassium salts thereof, triethylenetetramine-hexaacetic acid and sodium and potassium salts thereof, hydroxyethyl-ethylenediamine-triacetic acid and sodium and potassium salts thereof, nitrilo-triacetic acid and sodium and potassium salts thereof, 1,2-diamino-cyclohexane-tetraacetic acid and sodium and potassium salts thereof, and 1,3-diamino-2-propanol-tetraacetic acid and sodium and potassium salts thereof; and organic phosphonic acids such as 2-phosphonobutane-tri-carboxylic acid-1,2,4 and sodium and potassium salts thereof, 2-phosphonobutane-tricarboxylic acid-2,3,4 and sodium and potassium salts thereof, 1-phosphonoethane-tricarboxylic acid-1,2,2 and sodium and potassium salts thereof, 1-hydroxyethane-1,1-diphosphonic acid and sodium and potassium salts thereof, and amino-tri-(methylene phosphonic acid) and sodium and potassium salts thereof. The optimum amount of such a chelating agent to be incorporated into the developer may vary depending on the hardness and amount of water used, but it in general ranges from 0.01 to 5% by mass and more preferably 0.01 to 0.5% by mass on the basis of the mass of the developer practically used.

(Other Additives)

The developer used in the image-forming method of the present invention may if necessary comprise the following components in addition to the foregoing components. Such optional components include, for instance, organic carboxylic acids such as benzoic acid, phthalic acid, p-ethyl-benzoic acid, p-n-propyl-benzoic acid, p-isopropyl-benzoic acid, p-n-butyl-benzoic acid, p-t-butyl-benzoic acid, p-2-hydroxyethyl-benzoic acid, decanoic acid, salicylic acid and 3-hydroxy-2-naphthoic acid; organic solvents such as isopropyl alcohol, benzyl alcohol, ethyl cellosolve, butyl cellosolve, phenyl cellosolve, propylene glycol and diacetone alcohol; as well as chelating agents; reducing agents; dyes; pigments; water softener; and preservatives.

The foregoing developer can be used as a developer and a replenisher used for the development of an imagewise exposed negative-working image-forming material and it is preferably applied to an automatic developing machine. When developing such materials using an automatic developing machine, the developer is fatigued in proportion to the throughput and therefore, the processing capacity of the machine may be recovered by the use of a replenisher or a fresh developer. This system of replenishment is likewise preferably used in the image-making method of the present invention.

The image-forming material used in the image-forming method of the present invention is one comprising a substrate provided thereon with an optional undercoating layer, an image-recording layer and an optional protective layer laminated in order, wherein the foregoing image-recording layer comprises a composition containing components described below in detail.

In this respect, the term "laminated in order" means that the undercoating layer, the image-recording layer and the protective layer are formed in this order, the undercoating layer and the protective layer may be optional ones and the image-forming material may likewise comprise other layers (such as intermediate layers, back coating layers) depending on various purposes.

(Image-Recording Layer)

The negative-working image-forming material used in the image-forming method of the invention is one which comprises a substrate provided thereon with an image-recording layer containing an infrared light absorber, a polymerization initiator, an ethylenically unsaturated bond-containing monomer and a binder polymer. Each component will be detailed below.

(Infrared Light Absorber)

The image-recording layer of the image-forming material used in the invention should comprise an infrared light absorber. The infrared light absorber serves to convert the absorbed infrared light rays into heat. The heat thus generated thermally decomposes the polymerization initiator (radical-generating agent) as will be detailed later to thus generate radicals. The infrared light absorbers used in the invention are preferably dyes or pigments whose wavelengths of absorption maxima fall within the range of from 760 to 1200 nm.

Such dyes may be those commercially available and conventionally known ones such as those disclosed in, for instance, "A Handbook of Dyes" (edited by The Society of Organic Synthesis Chemistry in Japan, published in 1960 (Showa 45)). Specific examples thereof are azo dyes, metal complex azo dyes, pyrazolone azo dyes, naphthoquinone dyes, anthraquinone dyes, phthalocyanine dyes, carbonium dyes, quinone-imine dyes, methine dyes, cyanine dyes, squarylium dyes, pyrylium dyes and metal thiolate complexes.

Examples of preferred dyes are cyanine dyes such as those disclosed in, for instance, J.P. KOKAI Nos. Sho 58-125246, Sho 59-84356, Sho 59-202829 and Sho 60-78787; methine dyes such as those disclosed in, for instance, J.P. KOKAI Nos. Sho 58-173696, Sho 58-181690 and Sho 58-194595; naphthoquinone dyes such as those disclosed in, for instance, J.P. KOKAI Nos. Sho 58-112793, Sho 58-224793, Sho 59-48187, Sho 59-73996, Sho 60-52940 and Sho 60-63744; squarylium dyes such as those disclosed in, for instance, J.P. KOKAI Sho 58-112792; and cyanine dyes such as those disclosed in, for instance, U.K. Patent No. 434,875.

The near infrared light-absorbing sensitizers disclosed in U.S. Pat. No. 5,156,938 are also suitably used in the invention and preferably used herein also include, for instance, substituted arylbenzo(thio) pyrylium salts disclosed in U.S. Pat. No. 3,881,924; trimethine thia-pyrylium salts disclosed in J.P. KOKAI Sho 57-142645 (U.S. Pat. No. 4,327,169); pyrylium type compounds disclosed in J.P. KOKAI Nos. Sho 58-181051, Sho 58-220143, Sho 59-41363, Sho 59-84248, Sho 59-84249, Sho 59-146063 and Sho 59-146061; cyanine dyes disclosed in J.P. KOKAI Sho 59-216146; and penta-methine thio-pyrylium salts disclosed in U.S. Pat. No. 4,283,475; as well as pyrylium compounds disclosed in J.P. KOKOKU Nos. Hei 5-13514 and Hei 5-19702. Examples of other dyes preferably used herein are near infrared light-absorbing dyes represented by Formulas (I) and (II) in the specification of U.S. Pat. No. 4,756,993.

Moreover, examples of other infrared light-absorbing dyestuffs preferably used in the present invention are specific indolenine-cyanine dyestuffs disclosed in J.P. KOKAI 2002-278057 such as those listed below:

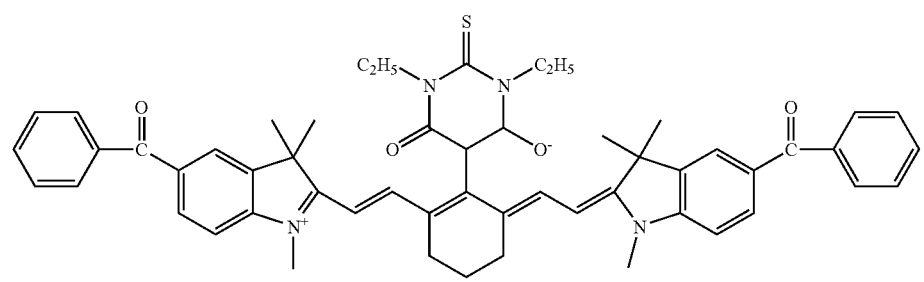

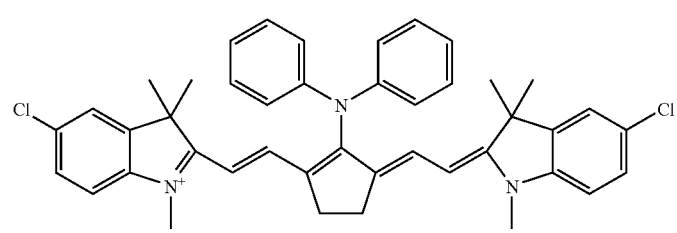

-continued

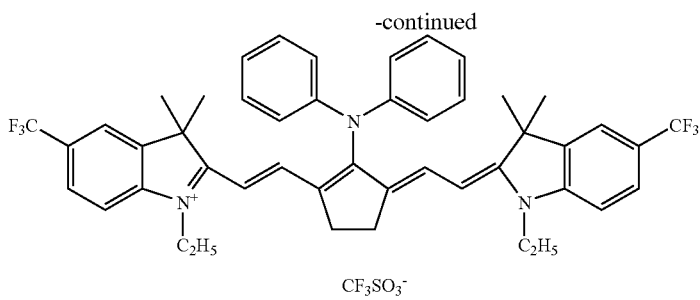

CF$_3$SO$_3^-$

Among these dyes, particularly preferred are cyanine dyestuffs, squarylium dyestuffs, pyrylium salts, nickel-thiolate complexes, indolenine-cyanine dyestuffs. Further, cyanine dyestuffs and indolenine-cyanine dyestuffs are more preferred and particularly preferred are cyanine dyestuffs represented by the following general formula (a):

General Formula (a)

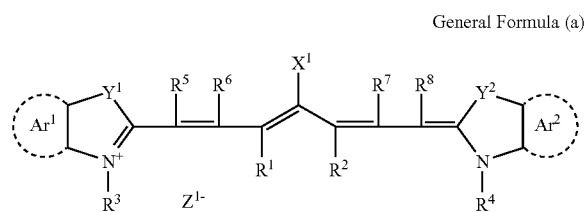

wherein, $X^1$ represents a hydrogen atom, a halogen atom, —NPh$_2$, $X^2$-$L^1$ or a group listed below. In this respect, $X^2$ represents an oxygen, nitrogen or sulfur atom and $L^1$ represents a hydrocarbon group having 1 to 12 carbon atoms, a hetero atom-containing aromatic ring or a hetero atom-containing hydrocarbon group having 1 to 12 carbon atoms. In this regard, the term "hetero atom" means N, S, O, a halogen atom or Se.

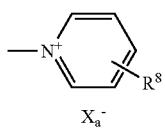

$X_a^-$ is defined like the substituent $Z^{1-}$ as will be described later, $R^a$ represents a substituent selected from the group consisting of a hydrogen atom, alkyl groups, aryl groups, substituted or unsubstituted amino groups and halogen atoms.

Each of $R^1$ and $R^2$ independently represents a hydrocarbon group having 1 to 12 carbon atoms. $R^1$ and $R^2$ preferably represent hydrocarbon groups each having at least two carbon atoms because of the storage stability of the coating solution for preparing a recording layer and they are particularly preferably bonded together to form a 5- or 6-membered ring.

$Ar^1$ and $Ar^2$ may be the same or different and each of them represents a substituted or unsubstituted aromatic hydrocarbon group. Preferred aromatic hydrocarbon groups are, for instance, benzene rings and naphthalene rings. In addition, examples of preferred substituents thereof are hydrocarbon groups having not more than 12 carbon atoms, halogen atoms and alkoxy groups having not more than 12 carbon atoms. $Y^1$ and $Y^2$ may be the same or different and each represents a sulfur atom or a dialkyl-methylene group having not more than 12 carbon atoms. $R^3$ and $R^4$ may be the same of different and each represents a substituted or unsubstituted hydrocarbon group having not more then 20 carbon atoms. Examples of preferred substituents thereof are alkoxy groups having not more than 12 carbon atoms, carboxyl group and sulfo group. $R^5$, $R^6$, $R^7$ and $R^8$ may be the same of different and each represents a hydrogen atom or a hydrocarbon group having not more then 12 carbon atoms and preferably a hydrogen atom because of the easy availability of the starting material. $Z^{1-}$ represents a counter anion. In this respect, however, $Z^{1-}$ is not needed when the cyanine dyestuff of Formula (a) includes an anionic substituent within the structure thereof and it is not necessary to neutralize the charges. Examples of $Z^{1-}$ preferably used herein are a halogen ion, a perchlorate ion, a tetrafluoroborate ion, a hexafluoro-phosphate ion and a sulfonate ion because of the storage stability of the coating solution for preparing a recording layer and particularly preferably a perchlorate ion, a hexafluoro-phosphate ion and an arylsulfonate ion.

Specific examples of the cyanine dyestuffs represented by Formula (a) preferably used in the invention are those disclosed in Sections 17 to 19 of J.P. KOKAI 2001-133969.

Moreover, particularly preferred other examples thereof are specific indolenine-cyanine dyestuffs disclosed in J.P. KOKAI 2002-278057 described above.

The pigments usable in the present invention are commercially available ones and those disclosed in A Handbook of Color Index (C.I.), "A Handbook of Up-To-Date Pigments" (edited by Society of Pigment Technology Japan, published in 1977), "Up-To-Date Pigments Application Technology" (CMC Publishing Co., Ltd., published in 1986) and "Printing Ink Technology" (CMC Publishing Co., Ltd., published in 1984).

Examples of pigments include black pigments, yellow pigments, orange pigments, brawn pigments, red pigments, purple pigments, blue pigments, green pigments, fluorescent pigments and metal powder pigments, as well as polymer-bonded dyestuffs. Specific examples thereof are insoluble azo pigments, azo lake pigments, condensed azo pigments, chelate azo pigments, phthalocyanine type pigments, anthraquinone type pigments, perylene and perinone type pigments, thioindigo type pigments, quinacridone type pigments, dioxazine type pigments, iso-indolinone type pigments, quinophthalone type pigments, printing lake pigments, azine pigments, nitroso pigments, nitro pigments, natural pigments, fluorescent pigments, inorganic pigments and carbon black. Among these pigments, preferably used herein is carbon black.

These pigments may be used without any surface treatment or may be subjected to a treatment. Examples of methods for such surface treatment are one in which the surface of the pigment is coated with a resin or wax; a method comprising adhering a surfactant to the pigment; and a method in which a reactive substance (such as a silane coupling agent, an epoxy compound, a poly(isocyanate)) is linked to the surface of the pigment. The foregoing surface-treating methods are disclosed in "Properties and Applications of Metal Soap" (Saiwai Shobo), "Printing Ink Technology" (CMC Publishing Co., Ltd., published in 1984) and "Up-To-Date Pigments Application Technology" (CMC Publishing Co., Ltd., published in 1986).

The particle size of the pigment preferably ranges from 0.01 to 10 μm, more preferably 0.05 to 1 μm and particularly preferably 0.1 to 1 μm. If the particle size of the pigment is less than 0.01 μm, the dispersed substances have insufficient stability in the coating solution for forming the image-recording layer, while if it exceeds 10 μm, the resulting image-recording layer would show insufficient uniformity.

The method for dispersing the pigment in the coating solution may be any known one used in the preparation of ink or toners. Examples of dispersing machines are an ultrasonic dispersing machine, a sand mill, an attritor, a pearl mill, a super mill, a ball mill, an impeller, a disperser, a KD mill, a colloid mill, a dynatron, a three-roll mill, and a press kneader. The details thereof are disclosed in "Up-To-Date Pigments Application Technology" (CMC Publishing Co., Ltd., published in 1986).

When these infrared light absorbers are added to the image-recording layer, they may be added to a layer simultaneous with other components or they may be added to a separate layer, but when preparing a negative-working lithographic printing plate precursor as a negative-working image-recording material, they are added to the layer in such a manner that the absorbance of the image-recording layer (light-sensitive layer) observed at the maximum absorption wavelength ranging from 760 to 1200 nm falls within the range of from 0.5 to 1.2 as determined by the reflection-determination method. The absorbance thereof preferably ranges from 0.6 to 1.15. If the absorbance is beyond the range specified above, the strength of the image area is reduced and the number of printed matters upon printing operation is accordingly reduced. The reason therefor is not clearly elucidated, but it would be assumed that if the absorbance is less than 0.5, the image-recording layer cannot sufficiently absorb infrared light rays applied and as a result, the radical polymerization reaction insufficiently proceeds in the overall image-recording layer. On the other hand, it would likewise be assumed that if the absorbance is higher than 1.2, only the outermost layer of the image-recording layer absorbs infrared light rays and the infrared light rays applied do not reach the area in the proximity to the substrate. As a result, any radical polymerization does not take place in the vicinity to the substrate and the adhesion between the substrate and the image-recording layer becomes correspondingly insufficient.

The absorbance of the image-recording layer can be controlled by appropriately adjusting the amount of the infrared light absorber to be added to the image-recording layer and the thickness of the layer. The absorbance can be determined according to the usual method. Examples of such determination methods are a method comprising the steps of forming, on a reflective substrate such as an aluminum substrate, an image-recording layer having a thickness properly determined in such a manner that the coated amount as determined after drying would fall within the range required for forming a lithographic printing plate and determining the reflected light density using an optical densitometer and a method comprising determining the absorbance using a spectrophotometer according to the reflection method which makes use of an integrating sphere.

(Polymerization Initiators)

The image-recording layer used in the invention comprises a polymerization initiator for initiating and promoting the curing reaction of an ethylenically unsaturated bond-containing polymerizable monomer, as will be described below. Such polymerization initiators may be, for instance, sulfonium salt polymerization initiators serving as thermal decomposition type radical generators which are thermally decomposed to thus generate radicals.

In the present invention, when such a sulfonium salt polymerization initiator is used simultaneously with the foregoing infrared light absorber and the image-recording layer is irradiated with an infrared laser, the infrared light absorber generates heat and the heat in turn permits the generation of radicals. In the present invention, such a combination would permit the heat-mode recording in high sensitivity.

Examples of such sulfonium salt polymerization initiators preferably used in the invention include onium salts represented by the following general formula (I):

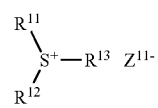

General Formula (I)

In the general formula (I), $R^{11}$, $R^{12}$ and $R^{13}$ may be the same or different and each represents a substituted or unsubstituted hydrocarbon group having not more than 20 carbon atoms. Examples of preferred substituents are halogen atoms, nitro groups, alkyl groups having not more than 12 carbon atoms, alkoxy groups having not more than 12 carbon atoms or aryloxy groups having not more than 12 carbon atoms. $Z^{11-}$ represents a counter ion selected from the group consisting of halogen ions, perchlorate ions, tetrafluoro-borate ions, hexafluoro-phosphate ions, carboxylate ions and sulfonate ions, with perchlorate ions, hexafluoro-phosphate ions, carboxylate ions and aryl-sulfonate ions being preferably used herein.

The following are specific examples of such onium salts ([OS-1] to [OS-10]), but the present invention is not restricted to these specific examples at all:

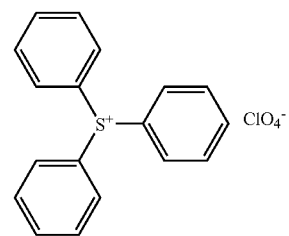

[OS-1]

[OS-2]
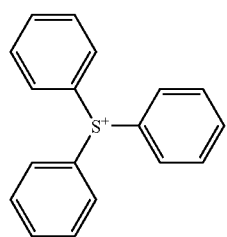 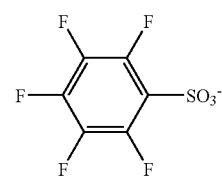
[OS-3]
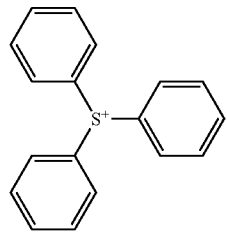 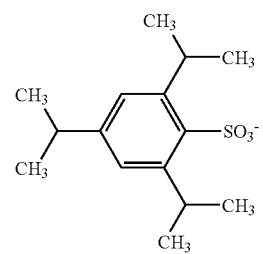
[OS-4]
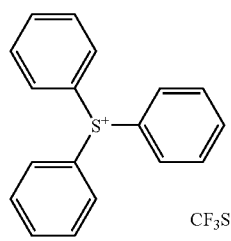
CF$_3$SO$_3^-$
[OS-5]
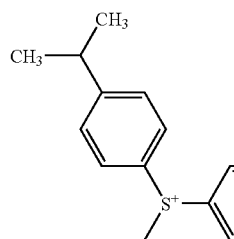
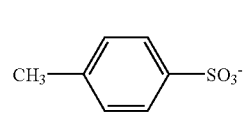
[OS-6]
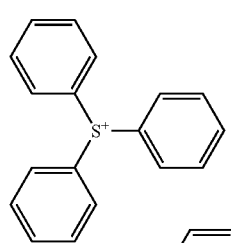
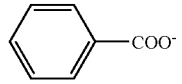COO$^-$
[OS-7]
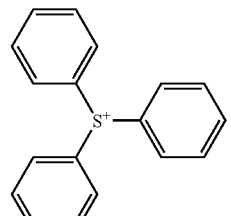
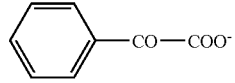
[OS-8]
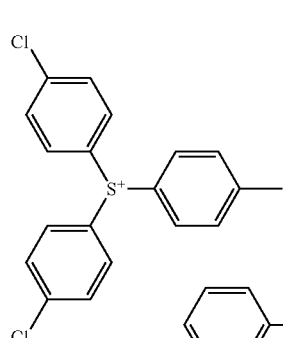
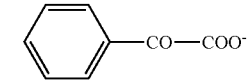
[OS-9]
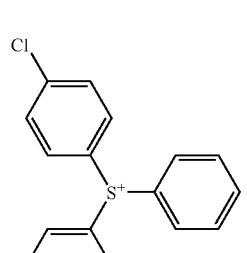
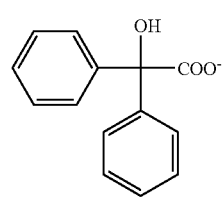
[OS-10]
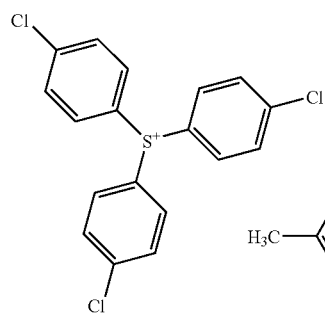
In addition to the onium salts listed above, preferably used herein also include, for instance, specific aromatic sulfonium salts such as those disclosed in J.P. KOKAI Nos. 2002-148790, 2002-350207 and 2002-6482.

The image-recording layer used in the invention may further comprise other polymerization initiator (other radical generators) simultaneous with the foregoing sulfonium salt polymerization initiator as an essential component.

Examples of such other radical generators are onium salts other than sulfonium salts, triazine compounds having a trihalomethyl group, peroxides, azo polymerization initiators, azide compounds, quinone-diazide, oxime ester compounds and triaryl monoalkyl-borate compounds. Among these, onium salts are preferred because of their high sensitivity.

Examples of other onium salts suitably used in the invention are iodonium salts and diazonium salts. In the present invention, these onium salts do not serve as acid-generators, but serve as radical polymerization initiators.

Examples of other onium salts usable in the invention include those represented by the following general formulas (II) and (III).

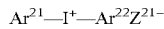  General Formula (II):

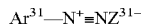  General Formula (III):

In Formula (II), each of $Ar^{21}$ and $Ar^{22}$ independently represents a substituted or unsubstituted aryl group having not more than 20 carbon atoms. When the aryl group is a substituted one, examples of preferred substituents include halogen atoms, nitro groups, alkyl groups having not more than 12 carbon atoms, alkoxy groups having not more than 12 carbon atoms, or aryloxy groups having not more than 12 carbon atoms. $Z^{21-}$ is a counter ion identical to that listed above in connection with $Z^{11-}$.

In Formula (III), $Ar^{31}$ represents a substituted or unsubstituted aryl group having not more than 20 carbon atoms. Examples of preferred substituents thereof are halogen atoms, nitro groups, alkyl groups having not more than 12 carbon atoms, alkoxy groups having not more than 12 carbon atoms, aryloxy groups having not more than 12 carbon atoms, alkylamino groups having not more than 12 carbon atoms, di-alkylamino groups having not more than 12 carbon atoms, arylamino groups having not more than 12 carbon atoms, or di-arylamino groups having not more than 12 carbon atoms. $Z^{31-}$ is a counter ion identical to that listed above in connection with $Z^{11-}$.

The following are specific examples of onium salts ([OI-1] to [OI-10]) represented by Formula (II) and onium salts ([ON-1] to [ON-5]) represented by Formula (III), preferably used in the present invention, but the present invention is not restricted to these specific examples at all:

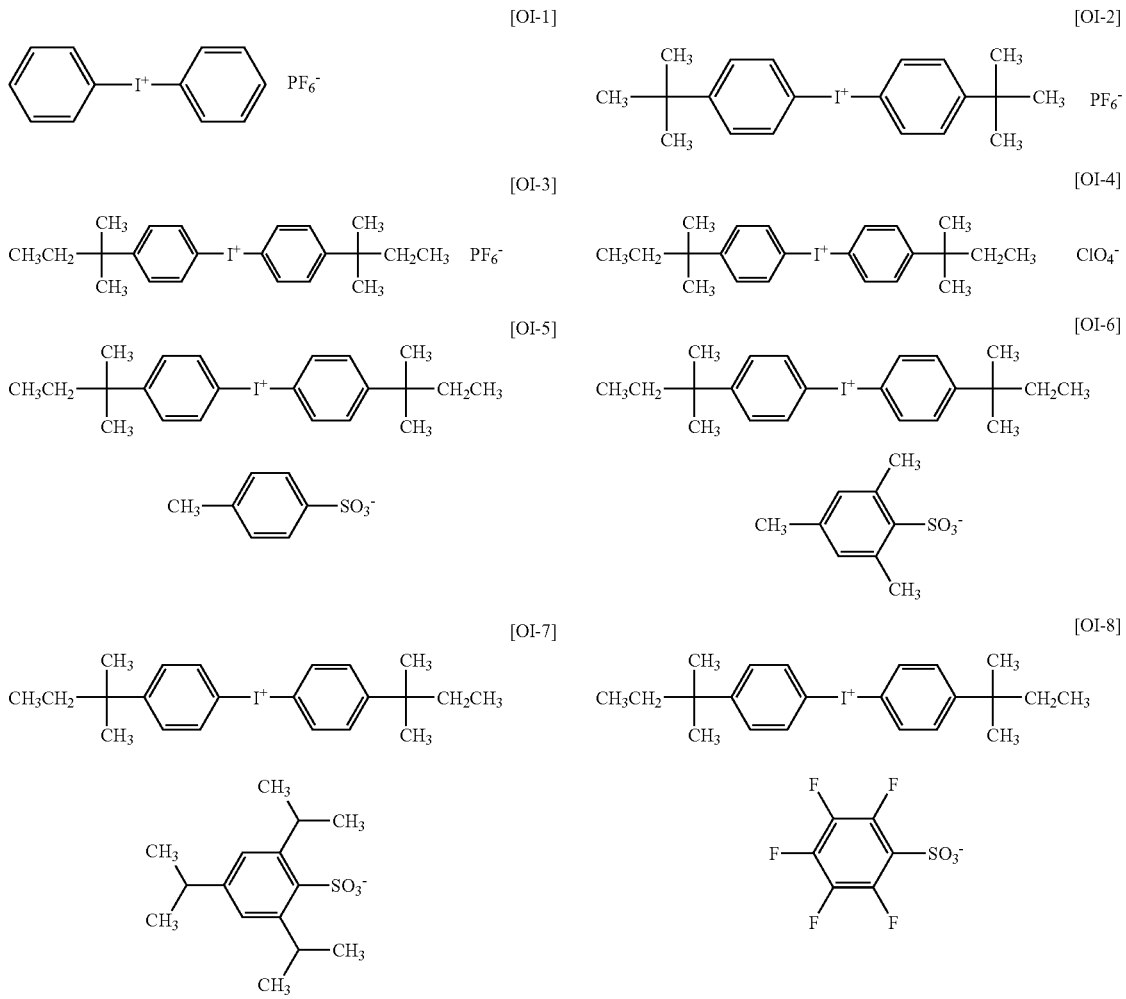

-continued

[OI-9]
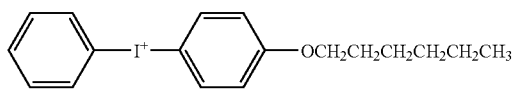

[OI-10]
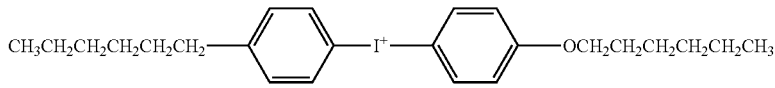

[ON-1]
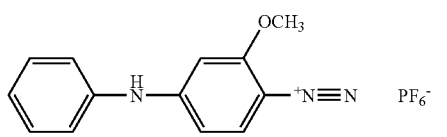

[ON-2]
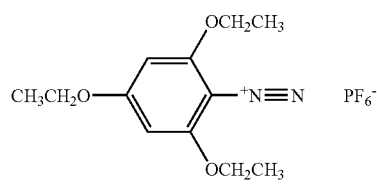

[ON-3]
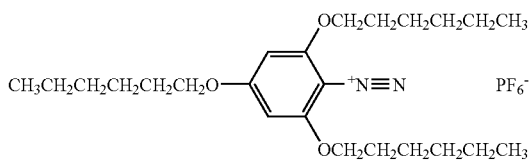

[ON-4]
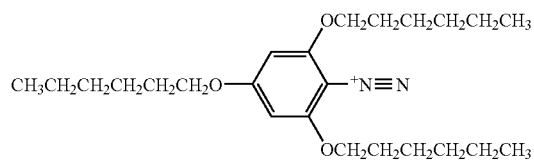

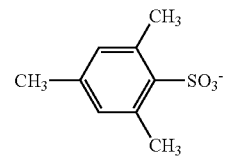

[ON-5]
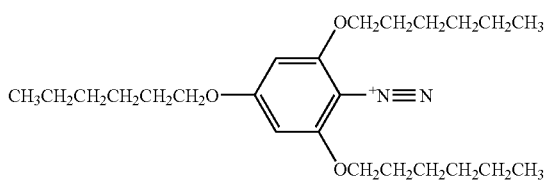

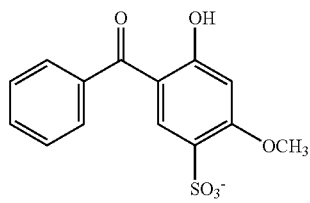

Specific examples of onium salts suitably used as polymerization initiators (radical generators) in the invention are those listed in J.P. KOKAI 2001-133696.

In this respect, the polymerization initiator (radical generators) used in the invention preferably has a maximum absorption wavelength of not more than 400 nm and more preferably not more than 360 nm. The use of such an absorption wavelength thus shifted toward the ultraviolet region would permit the handling of the image-forming material under the irradiation with white light rays.

The total content of the polymerization initiator in the image-recording layer used in the invention ranges from 0.1 to 50% by mass, preferably 0.5 to 30% by mass and particularly preferably 1 to 20% by mass on the basis of the total mass of the solid contents. If the content thereof is less than 0.1% by mass, the resulting layer has a reduced sensitivity, while if it exceeds 50% by mass, there is observed such a tendency that when the recording layer is applied to a lithographic printing plate precursor, the non-image area of the resulting printing plate easily causes staining during printing operations.

A single polymerization initiator or any combination of at least two such initiators may be used in the invention insofar as it comprises a sulfonium salt polymerization initiator as an essential component. In case where at least two polymerization initiators are used in combination, they may simply comprise a plurality of sulfonium salt polymerization initiators or they may be mixtures of sulfonium salt polymerization initiators and other polymerization initiators.

When using a combination of a sulfonium salt polymerization initiator with another polymerization initiator, the mixing ratio (by mass) of the former to the latter preferably ranges from 100/1 to 100/50 and more preferably 100/5 to 100/25.

Moreover, the polymerization initiator is incorporated into the image-recording layer and the initiator may be added to a layer simultaneous with the other components or to a separate layer.

(Ethylenically Unsaturated Bond-Containing Monomers)

The image-recording layer usable in the present invention comprises an ethylenically unsaturated bond-containing monomer. The monomer is an addition-polymerizable compound having at least one ethylenically unsaturated bond in the molecule and it may be selected from the group consisting of such compounds having at least one, preferably at least two ethylenically unsaturated bonds in the molecule. Various groups of such compounds have widely been known in this art and they may be used in the invention without any particular restriction. They may be in a variety of chemical forms such as monomers; prepolymers or dimmers, trimers and higher oligomers; or mixture thereof; and copolymers thereof. Examples of such monomers and copolymers thereof are unsaturated carboxylic acids (such as acrylic acid, methacrylic acid, itaconic acid, crotonic acid, iso-crotonic acid and maleic acid) and esters and amides thereof and preferably used herein are, for instance, esters of unsaturated carboxylic acids with aliphatic polyhydric alcohols and amides of unsaturated carboxylic acids with aliphatic polyvalent amine compounds. Suitably used herein also include, for instance, addition reaction products of unsaturated carboxylic acid esters or amides carrying a nucleophilic substituent such as hydroxyl, amino and/or mercapto groups with mono-functional or multi-functional isocyanates or epoxides; and dehydration-condensation reaction products of the foregoing esters or amides with mono-functional or multi-functional carboxylic acids. Suitably used herein likewise include, for instance, addition reaction products of unsaturated carboxylic acid esters or amides carrying an electrophilic substituent such as isocyanate and/or epoxy groups with mono-functional or multi-functional alcohols, amines and/or thiols; and substitution reaction products of unsaturated carboxylic acid esters or amides carrying a releasable substituent such as halogen atoms and/or tosyloxy group with mono-functional or multi-functional alcohols, amines and/or thiols. Examples of such monomers usable herein further include the foregoing compounds in which the foregoing unsaturated carboxylic acids are replaced with unsaturated sulfonic acids, styrene and/or vinyl ethers.

Specific examples of ester monomers of aliphatic polyhydric alcohols with unsaturated carboxylic acids are acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyl-oxy-propyl) ether, trimethylol-ethane triacrylate, hexane-diol diacrylate, 1,4-cyclohexane-diol diacrylate, tetraethylene glycol diacrylate, pentaerythritol diacrylate, pentaerythritol triacrylate, pentaerythritol tetra-acrylate, di-pentaerythritol diacrylate, di-pentaerythritol hexa-acrylate, sorbitol triacrylate, sorbitol tetra-acrylate, sorbitol penta-acrylate, sorbitol hexa-acrylate, tri(acryloyl-oxy-ethyl) isocyanurate, and polyester acrylate oligomers.

Specific examples of ester monomers include methacrylates such as tetramethylene glycol di-methacrylate, triethylene glycol di-methacrylate, neopentyl glycol di-methacrylate, trimethylolpropane tri-methacrylate, trimethylol-ethane tri-methacrylate, ethylene glycol di-methacrylate, 1,3-butanediol di-methacrylate, hexane-diol di-methacrylate, pentaerythritol di-methacrylate, pentaerythritol tri-methacrylate, pentaerythritol tetra-methacrylate, di-pentaerythritol di-methacrylate, di-penta-erythritol hexa-acrylate, sorbitol tri-methacrylate, sorbitol tetra-methacrylate, bis[p-(3-methacryloxy-2-hydroxy-propoxy)phenyl]dimethyl methane and bis[p-(methacryloxy-ethoxy)phenyl]dimethyl-methane.

Specific examples of ester monomers include itaconates such as ethylene glycol di-itaconate, propylene glycol di-itaconate, 1,3-butanediol di-itaconate, 1,4-butanediol di-itaconate, tetramethylene glycol di-itaconate, pentaerythritol di-itaconate, and sorbitol tetra-itaconate.

Specific examples of ester monomers include crotonates such as ethylene glycol di-crotonate, tetramethylene glycol di-crotonate, pentaerythritol di-crotonate and sorbitol tetra-crotonate.

Specific examples of ester monomers include isocrotonates such as ethylene glycol di-isocrotonate, pentaerythritol di-isocrotonate, and sorbitol tetra-isocrotonate.

Specific examples of ester monomers include maleates such as ethylene glycol di-maleate, triethylene glycol di-maleate, pentaerythritol di-maleate, and sorbitol tetra-maleate.

Examples of other ester monomers are esters of aliphatic alcohols such as those disclosed in J.P. KOKOKU Nos. Sho 46-27926 and Sho 51-47334 and J.P. KOKAI Sho 57-196231; ester monomers having aromatic skeletons such as those disclosed in J.P. KOKAI Nos. Sho 59-5240, Sho 59-5241 and Hei 2-226149; and ester monomers having amino groups such as those disclosed in J.P. KOKAI Hei 1-165613. Moreover, the foregoing ester monomers may be used as a mixture.

In addition, examples of amide monomers of aliphatic polyvalent amine compounds with unsaturated carboxylic acids include methylene-bis-acrylamide, methylene-bis-methacrylamide, 1,6-hexamethylene-bis-acrylamide, 1,6-hexamethylene-bis-methacrylamide, diethylene triamine tris-acrylamide, xylylene-bis-acrylamide, and xylylene-bis-methacrylamide. Examples of other amide type monomers preferably used herein are those having cyclohexylene structures such as those disclosed in J.P. KOKOKU Sho 54-21726.

Moreover, preferably used herein also include urethane type addition polymerizable compounds prepared while making use of the addition reactions of isocyanates with compounds having hydroxyl groups and specific examples thereof are vinyl urethane compounds having at least two polymerizable vinyl groups in the molecule, which can be prepared by adding hydroxyl group-containing vinyl monomers represented by the following general formula to polyisocyanate compounds carrying at least two isocyanate groups in the molecule, such as those disclosed in J.P. KOKOKU Sho 48-41708:

$CH_2=C(R)COOCH_2CH(R')-OH$ wherein, each of R and R' represents —H or —$CH_3$.

Suitably used herein likewise include, for instance, urethane acrylates such as those disclosed in J.P. KOKAI Sho 51-37193 and J.P. KOKOKU Nos. Hei 2-32293 and Hei 2-16765; and urethane compounds having ethylene oxide type skeletons such as those disclosed in J.P. KOKOKU Nos. Sho 58-49860, Sho 56-17654, Sho 62-39417 and Sho 62-39418. Furthermore, the use of addition polymerizable compounds having amino and/or sulfide structures in the molecule such as those disclosed in J.P. KOKAI Nos. Sho 63-277653, Sho 63-260909 and Hei 1-105238 would permit the preparation of a photopolymerizable composition quite excellent in the photo-polymerization speed.

Other examples of the foregoing monomers are multi-functional acrylates and methacrylates such as polyester acrylates and epoxy acrylates obtained by reacting epoxy resins with (meth)acrylic acids such as those disclosed in J.P. KOKAI Sho 48-64183 and J.P. KOKOKU Nos. Sho 49-43191 and Sho 52-30490; specific unsaturated compounds such as those disclosed in J.P. KOKOKU Nos. Sho 46-43946, Hei 1-40337 and Hei 1-40336 and vinyl phosphonic acid type compounds such as those disclosed in J.P. KOKAI Hei 2-25493; monomers having structures containing perfluoro-alkyl groups such as those disclosed in J.P. KOKAI Sho 61-22048, which are suitably used in some cases; and those introduced, as optically curable monomers or oligomers, in Bulletin of Adhesive Society of Japan, 1984, Vol. 20, No. 7, pp. 300–308.

Regarding these ethylenically unsaturated bond-containing monomers, the details concerning, for instance, the structures, the manner of use (independent use or use in combination), and the amount to be added can arbitrarily be determined or selected in the light of the ultimate quality design thereof. For instance, the details of the monomers may be selected on the basis of the following standpoints. Preferably used such monomers are those having a structure containing a large number of unsaturated bonds in the molecule and in most of cases, preferably used are those having at least two functional groups, from the viewpoint of the photopolymerization speed. Moreover, those having at least three functional groups are preferably used in case where it is desired to increase the strength of the image area or the cured film and it is also effective to combine these monomers in such a manner that they comprise those having different numbers of functional groups and/or polymerizable groups (such as acrylic acid esters, methacrylic acid esters, styrene type compounds, vinyl ether type compounds), for the simultaneous control of the both light-sensitivity and strength. Compounds having high molecular weights and those having high hydrophobicity are effective for the preparation of image-recording layer excellent in the both polymerization speed and strength, but they suffer from problems such that the layer is insufficient in the developing speed and it is accompanied by the formation of precipitates in the developer used. Further, the selection of addition polymerizable compounds and the manner of using the same are quite important in consideration of the compatibility with other components in the composition (such as a binder polymer, an initiator and a coloring agent) and the dispersibility of the same in the composition. In this respect, the compatibility may sometimes be improved by, for instance, the use of low purity compounds or the simultaneous use of at least two compounds.

In addition, when applied to a lithographic printing plate precursor, the use of such a compound having a specific structure may be selected in order to improve the adhesion of the image-recording layer to, for instance, the substrate and an overcoat layer as will be described below.

Regarding the rate of the ethylenically unsaturated bond-containing monomer to be incorporated into the image-recording layer, the higher the rate of the monomer, the higher the sensitivity of the resulting layer, but if the rate is too high, various problems arise, for instance, the resulting composition causes undesirable phase separation, various troubles possibly encountered in the production processes (such as the production of rejects due to the transfer and adhesion of some components of the image-recording layer) are caused due to the stickiness of the image-recording layer when applied to a lithographic printing plate precursor and precipitates are formed in a developer during development. From the foregoing standpoints, the amount of the ethylenically unsaturated bond-containing monomer preferably ranges from 5 to 80% by mass and more preferably 25 to 75% by mass on the basis of the mass of the non-volatile components present in the composition. Moreover, these monomers may be used alone or in any combination. Besides, the structure, mixing ratio and added amount of the monomer can arbitrarily and appropriately be selected while taking into consideration the magnitude of the polymerization-inhibitory effect with respect to oxygen, resolution, fogging, refractive index changes and surface stickiness. When forming an image-recording layer by applying a composition for image-recording layers, the layer may have a layer structure comprising an under coat and a top coat according to a method for forming such a layer structure.

(Binder Polymers)

The binder polymer incorporated into the image-recording layer used in the invention is added to the composition for the purpose of improving the quality of the resulting film and may be a variety of polymers inasmuch as they have an effect of improving the quality of the resulting film. Binder polymers suitably used in the invention are those having repeating units represented by the following general formula (i) among others:

General Formula (i)

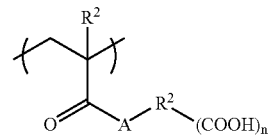

The binder polymer having repeating units represented by the foregoing general formula (i) will occasionally be referred to also as "specific binder polymer" and will be described in detail below.

First, $R^1$ appearing in Formula (i) represents a hydrogen atom or a methyl group, with a methyl group being particularly preferred.

The connecting group represented by $R^2$ in Formula (i) is one constituted by hydrogen, oxygen, nitrogen, sulfur and/or halogen atoms and having a number of atoms except for those included in substituents ranging from 2 to 30. Specific examples thereof are alkylene, substituted alkylene, arylene and substituted arylene groups. The connecting group may have a structure formed by coupling a plurality of the foregoing bivalent groups through amide bonds and/or ester bonds.

Examples of connecting groups having chain structures are ethylene and propylene groups. Examples of preferred connecting groups also include those having structures obtained by connecting these alkylene groups through ester bonds.

Among these connecting groups represented by $R^2$ in Formula (i), preferably used in the invention are hydrocarbon groups having a valency of (n+1) and aliphatic ring structures each having 3 to 30 carbon atoms. Specific examples thereof are compounds having aliphatic ring structures such as cyclopropane, cyclopentane, cyclohexane, cycloheptane, cyclooctane, cyclodecane, di-cyclohexyl, ter-cyclohexyl, and norbornane, which may be substituted with at least one arbitrarily selected substituent, whose hydrogen atoms (n+1) present on any carbon atom constituting the compound are removed to thus form hydrocarbon groups each having a valency of (n+1). $R^2$ preferably has 3 to 30 carbon atoms including those constituting the substituents.

At least one carbon atom of the compound constituting the aliphatic ring structure may be replaced with a hetero atom selected from the group consisting of nitrogen, oxygen and sulfur atoms. When taking into consideration the printing durability of the resulting printing plate, $R^2$ in Formula (i) is preferably a hydrocarbon group having a valency of (n+1) and a substituted or unsubstituted aliphatic ring structure which has 3 to 30 carbon atoms and includes at least two rings, such as a condensed polycyclic aliphatic hydrocarbon, a crosslinked cyclic aliphatic hydrocarbon, a spiro-aliphatic hydrocarbon or a collected aliphatic hydrocarbon ring (an assembly obtained by connecting a plurality of rings through bonds or connecting groups). In this case, the number of carbon atoms includes those present in the substituents.

Further, the connecting group represented by $R^2$ is preferably one having 5 to 10 carbon atoms and is also preferably one having a chain structure containing ester bonds in the structure or one having a ring structure such as that described above, while taking into consideration the structure thereof.

The substituents capable of being introduced into the connecting group represented by $R^2$ may be non-metallic monovalent atomic groups except for hydrogen atom. Specific examples thereof are halogen atoms (—F, —Br, —Cl, —I), hydroxyl group, alkoxy groups, aryloxy groups, mercapto groups, alkyl-thio groups, aryl-thio groups, alkyl-dithio groups, aryl-dithio groups, amino groups, N-alkylamino groups, N,N-dialkyl-amino groups, N-arylamino groups, N,N-diaryl-amino groups, N-alkyl-N-arylamino groups, acyloxy groups, carbamoyloxy groups, N-alkyl-carbamoyloxy groups, N-aryl-carbamoyloxy groups, N,N-dialkyl-carbamoyloxy groups, N,N-diaryl-carbamoyl-oxy groups, N-alkyl-N-aryl-carbamoyloxy groups, alkyl-sulfoxy groups, aryl-sulfoxy groups, acylthio groups, acylamino groups, N-alkyl-acylamino groups, N-aryl-acyl-amino groups, ureido group, N'-alkyl-ureido groups, N',N'-dialkyl-ureido groups, N'-aryl-ureido groups, N',N'-diaryl-ureido groups, N'-alkyl-N'-aryl-ureido groups, N-alkyl-ureido groups, N-aryl-ureido groups, N'-alkyl-N-alkyl-ureido groups, N'-alkyl-N-aryl-ureido groups, N',N'-dialkyl-N-alkyl-ureido groups, N',N'-dialkyl-N-aryl-ureido groups, N'-aryl-N-alkyl-ureido groups, N'-aryl-N-aryl-ureido groups, N',N'-diaryl-N-alkyl-ureido groups, N',N'-diaryl-N-aryl-ureido groups, N'-alkyl-N'-aryl-N-alkyl-ureido groups, N'-alkyl-N'-aryl-N-aryl-ureido groups, alkoxy-carbonylamino groups, aryloxy-carbonylamino groups, N-alkyl-N-alkoxy-carbonylamino groups, N-alkyl-N-aryloxy-carbonylamino groups, N-aryl-N-alkoxy-carbonylamino groups, N-aryl-N-aryloxy-carbonylamino groups, formyl group, acyl groups, carboxyl groups and conjugated base groups thereof, alkoxy-carbonyl groups, aryloxy-carbonyl groups, carbamoyl groups, N-alkyl-carbamoyl groups, N,N-dialkyl-carbamoyl groups, N-aryl-carbamoyl groups, N,N-diaryl-carbamoyl groups, N-alkyl-N-aryl-carbamoyl groups, alkyl-sulfinyl groups, aryl-sulfinyl groups, alkyl-sulfonyl groups, aryl-sulfonyl groups, sulfo group (—SO$_3$H) and conjugated base groups thereof, alkoxy-sulfonyl groups, aryloxy-sulfonyl groups, sulfinamoyl groups, N-alkyl-sulfinamoyl groups, N,N-dialkyl-sulfinamoyl groups, N-aryl-sulfinamoyl groups, N,N-diaryl-sulfinamoyl groups, N-alkyl-N-aryl-sulfinamoyl groups, sulfamoyl groups, N-alkyl-sulfamoyl groups, N,N-dialkyl-sulfamoyl groups, N-aryl-sulfamoyl groups, N,N-diaryl-sulfamoyl groups, N-alkyl-N-aryl-sulfamoyl groups, N-acyl-sulfamoyl groups and conjugated base groups thereof, N-alkylsulfonyl-sulfamoyl groups (—SO$_2$NHSO$_2$ (alkyl)) and groups derived from conjugated bases thereof, N-arylsulfonyl-sulfamoyl groups (—SO$_2$NHSO$_2$ (aryl)) and groups derived from conjugated bases thereof, N-alkylsulfonyl-carbamoyl groups (—CONHSO$_2$ (alkyl)) and groups derived from conjugated bases thereof, N-arylsulfonyl-carbamoyl groups (—CO—NHSO$_2$ (aryl)) and groups derived from conjugated bases thereof, alkoxy-silyl groups (—Si(O-alkyl)$_3$), aryloxy-silyl groups (—Si(O-aryl)$_3$), hydroxy-silyl groups (—Si(OH)$_3$) and groups derived from conjugated bases thereof, phosphono groups (—PO$_3$H$_2$) and groups derived from conjugated bases thereof, dialkyl-phosphono groups (—PO$_3$(alkyl)), diaryl-phosphono groups (—PO$_3$(aryl)), alkylaryl-phosphono groups (—PO$_3$(alkyl)(aryl)), mono-alkyl-phosphono groups (—PO$_3$H(alkyl)) and groups derived from conjugated bases thereof, monoaryl-phosphono groups (—PO$_3$H(aryl)) and groups derived from conjugated bases thereof, phosphono-oxy groups (—OPO$_3$H) and groups derived from conjugated bases thereof, dialkyl-phosphono-oxy groups (—OPO$_3$(alkyl)), diaryl-phosphono-oxy groups (—OPO$_3$(aryl)$_2$), alkylaryl-phosphono-oxy groups (—OPO$_3$(alkyl)(aryl)), monoalkyl-phosphono-oxy groups (—OPO$_3$H(alkyl)) and groups derived from conjugated bases thereof, monoaryl-phosphono-oxy groups (—OPO$_3$H (aryl)) and groups derived from conjugated bases thereof, cyano group, nitro group, dialkyl-boryl groups (—B(alkyl)$_2$), diaryl-boryl groups (—B(aryl)$_2$), alkylaryl-boryl groups (—B(alkyl)(aryl)), di-hydroxy-boryl group (—B(OH)$_2$) and groups derived from conjugated bases thereof, alkylhydroxy-boryl groups (—B(alkyl)(OH)) and groups derived from conjugated bases thereof, arylhydroxy-boryl groups (—B(aryl)(OH)) and groups derived from conjugated bases thereof, aryl groups, alkenyl groups and alkynyl groups.

In the image-forming material used in the invention, substituents having hydrogen atoms capable of forming hydrogen bonds and, in particular, those having such an acidity that the acid dissociation constant (pKa) thereof is smaller than that of the carboxylic acid are not preferably used since they have a tendency of reducing the printing durability of the resulting printing plate, although this is dependent on the design of the image-recording layer. On the other hand, the use of halogen atoms and hydrophobic substituents such as hydrocarbon groups (such as alkyl, aryl, alkenyl and alkynyl groups), alkoxy groups and aryloxy groups is preferred since they have a tendency of improving the printing durability of the resulting printing plate and, in particular, when the ring structure is a 6-membered or lower mono-cyclic aliphatic hydrocarbon such as cyclopentane or cyclohexane, the binder polymers preferably have such hydrophobic substituents. These substituents may, if possible, form a ring between them or through the formation of linkages with the hydrocarbon group to which they are bonded or the substituents may further have substituents.

When A in Formula (i) is $NR^3$—, $R^3$ represents a hydrogen atom or a monovalent hydrocarbon group having 1 to 10 carbon atoms. Examples of such monovalent hydrocarbon group having 1 to 10 carbon atoms represented by $R^3$ are alkyl, aryl, alkenyl and alkynyl groups.

Specific examples of alkyl groups are linear, branched or cyclic alkyl groups having 1 to 10 carbon atoms such as methyl, ethyl, propyl, butyl, pentyl, hexyl, heptyl, octyl, nonyl, decyl, isopropyl, isobutyl, sec-butyl, tert-butyl, isopentyl, neopentyl, 1-methylbutyl, isohexyl, 2-ethylhexyl, 2-methylhexyl, cyclopentyl, cyclohexyl, 1-adamantyl and 2-norbornyl groups.

Specific examples of aryl groups are those having 6 to 10 carbon atoms such as phenyl, naphthyl and indenyl groups; and hetero-aryl groups containing a hetero atom selected from the group consisting of nitrogen, oxygen and sulfur atoms and having 4 to 10 carbon atoms such as furyl, thienyl, pyrrolyl, pyridyl, quinolyl groups.

Specific examples of alkenyl groups are linear, branched or cyclic alkenyl groups having 2 to 10 carbon atoms such as vinyl, 1-propenyl, 1-butenyl, 1-methyl-1-propenyl, 1-cyclopentenyl and 1-cyclohexenyl groups.

Specific examples of alkynyl groups are those having 2 to 10 carbon atoms such as ethynyl, 1-propynyl, 1-butynyl and 1-octynyl groups. The substituents which may be introduced into $R^3$ are the same as those listed above in connection with the substituents capable of being introduced into $R^2$. In this respect, however, the number of carbon atoms of $R^3$ ranges from 1 to 10 including that present in the substituent.

The symbol A appearing in Formula (i) is preferably an oxygen atom or —NH— since such a compound can easily be prepared.

In Formula (i), n is an integer ranging from 1 to 5 and preferably 1 from the viewpoint of the printing durability of the resulting printing plate.

The following are specific examples of preferred repeating units represented by Formula (i), but the present invention is not restricted to these specific examples at all.

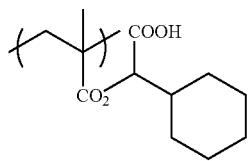

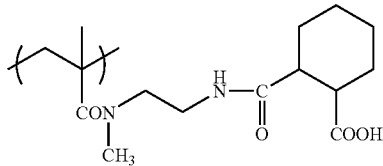

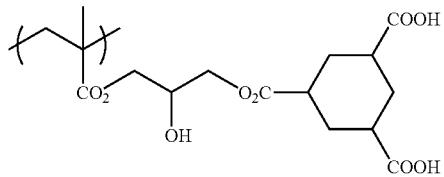

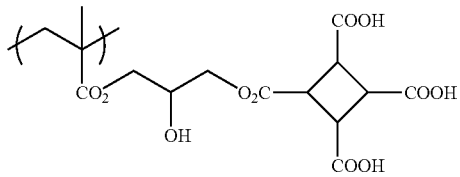

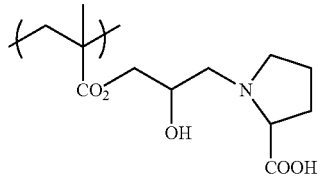

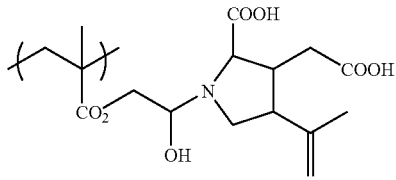

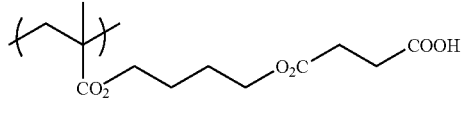

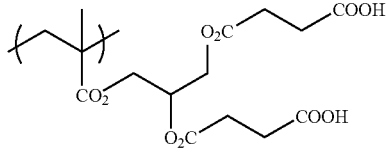

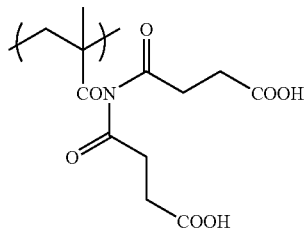

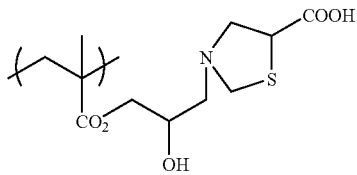

-continued
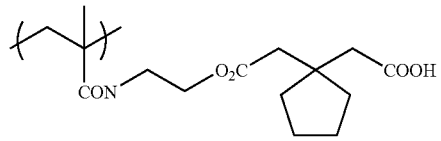
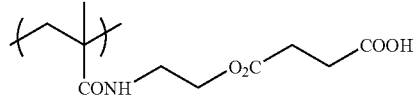
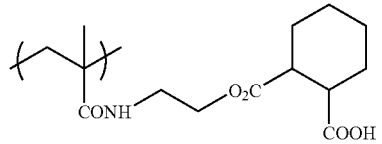
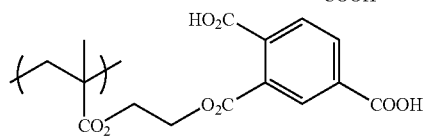
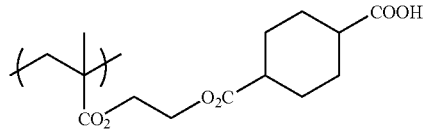
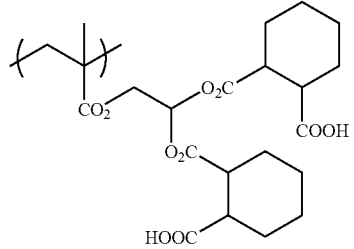
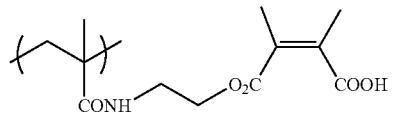
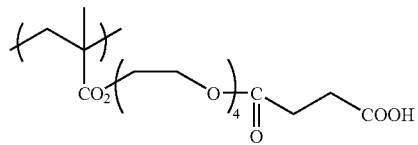
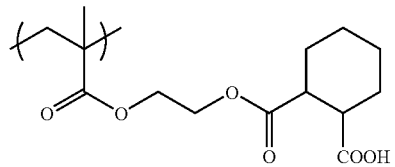
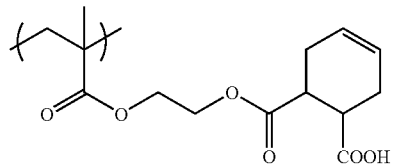
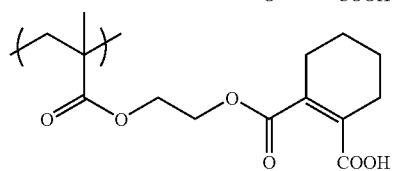
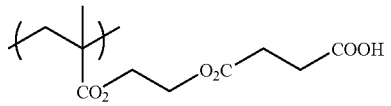
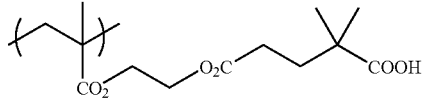
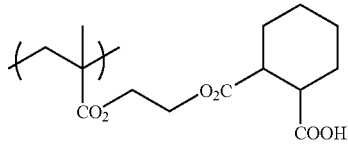
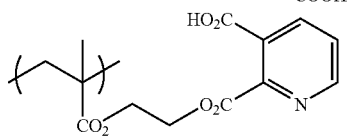
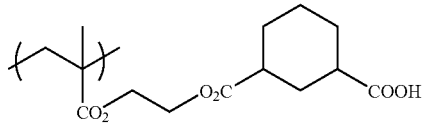
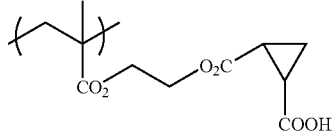
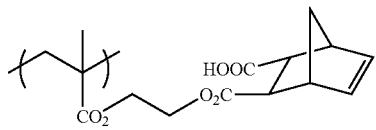
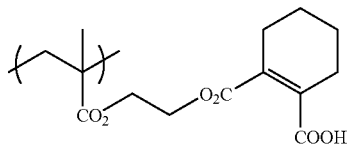
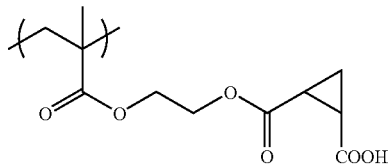
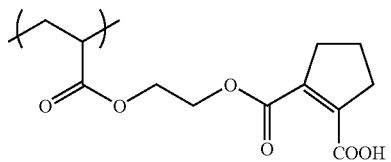
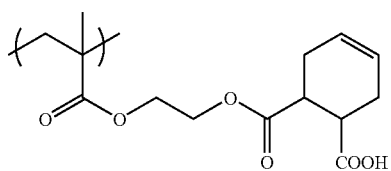

-continued
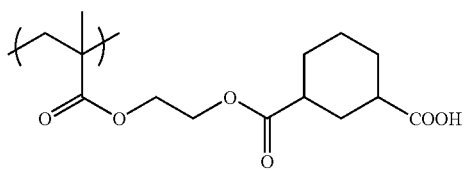
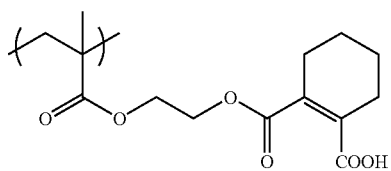
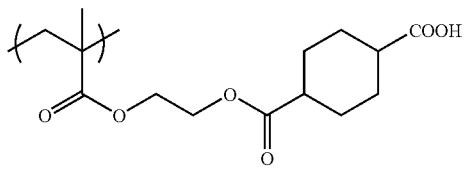
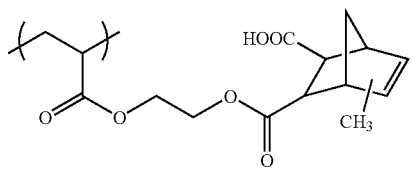
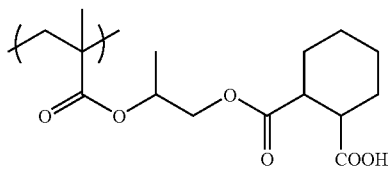
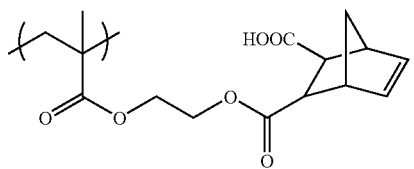
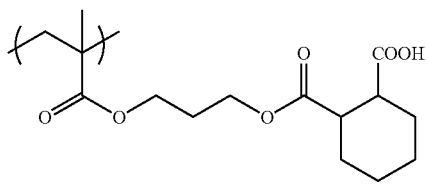
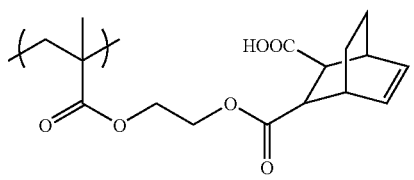
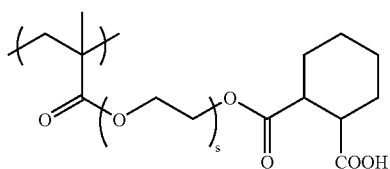
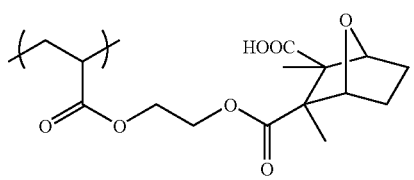
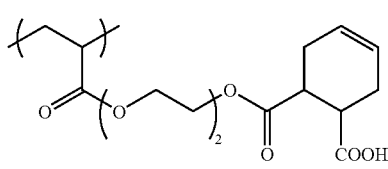
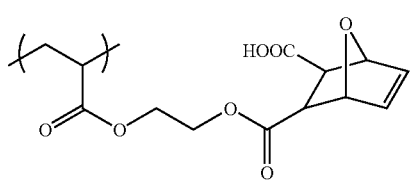
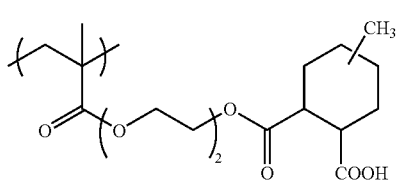
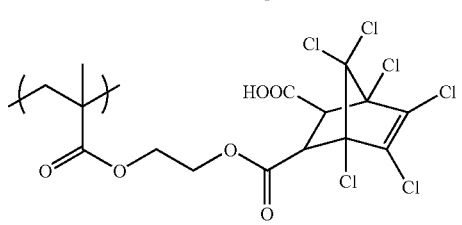
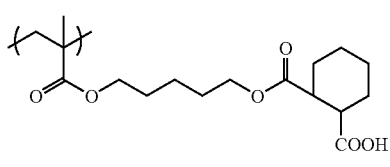
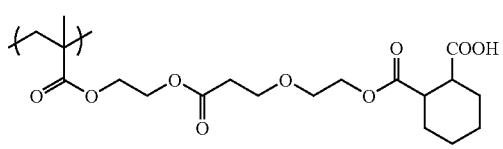
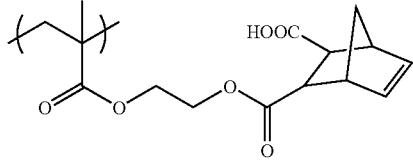
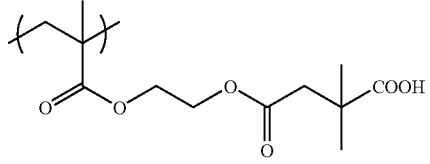

-continued
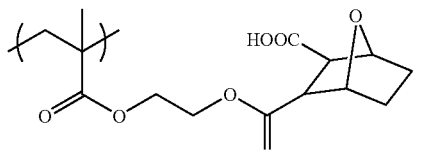
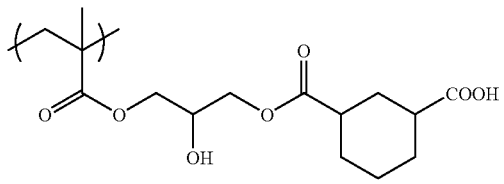
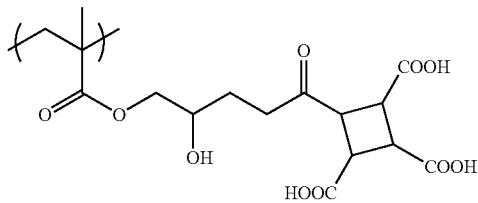
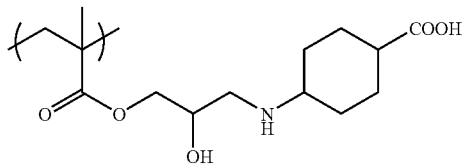
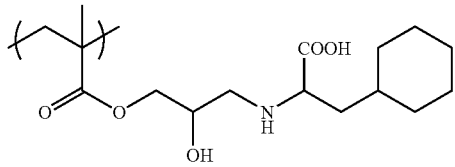
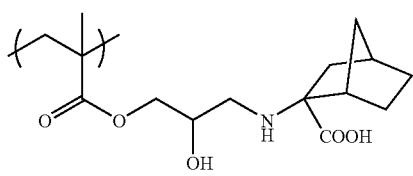
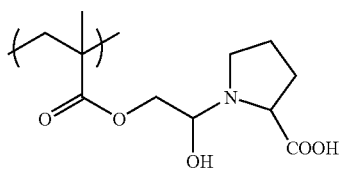
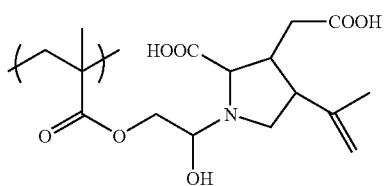
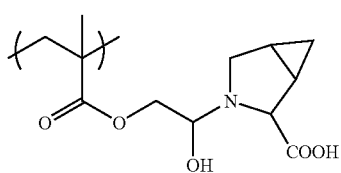
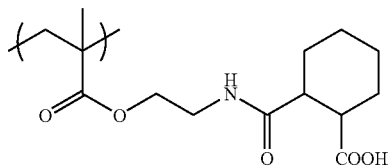
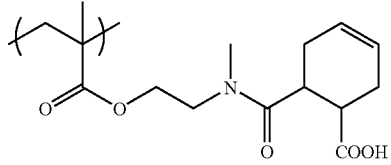
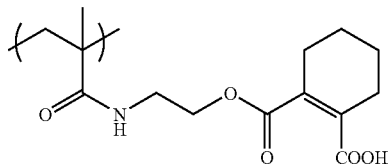
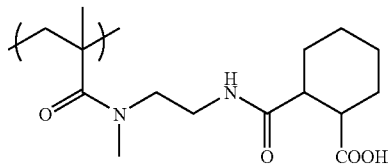
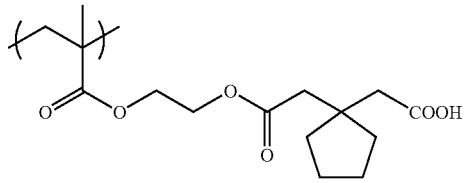
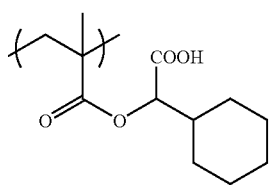
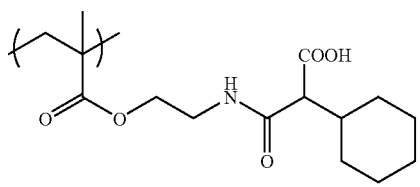
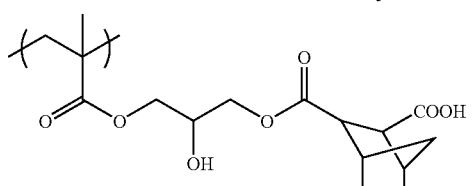
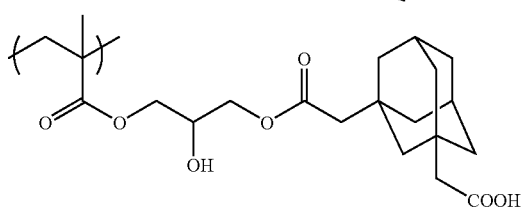

-continued
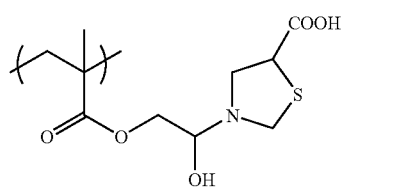
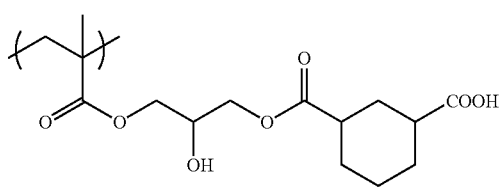
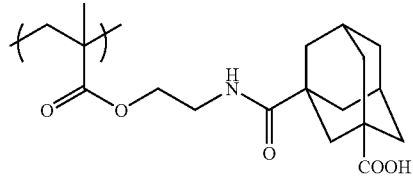
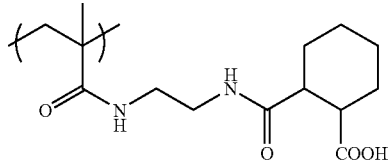
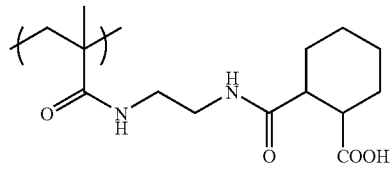
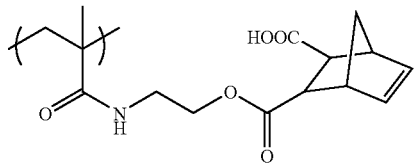
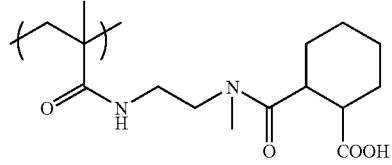
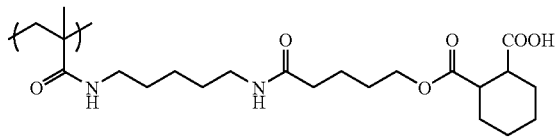
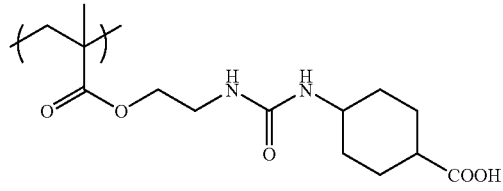
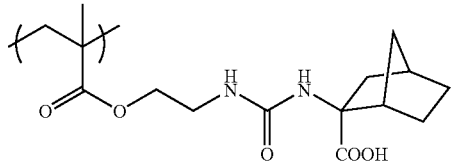
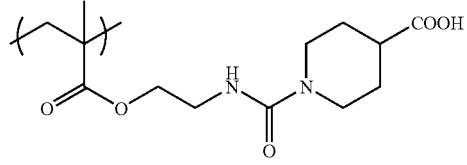
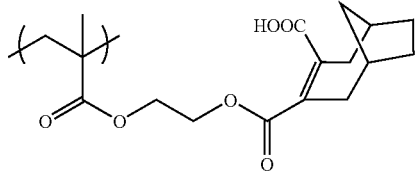
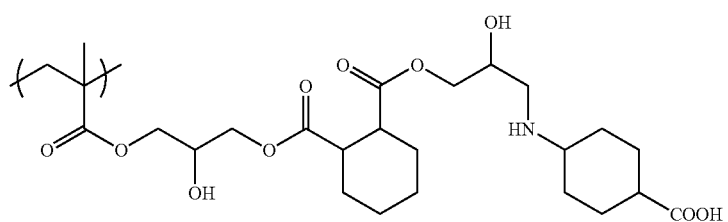
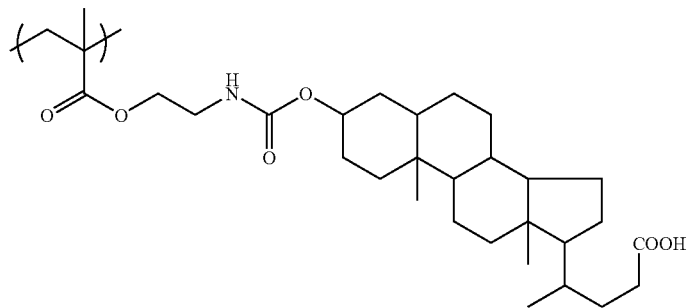

-continued

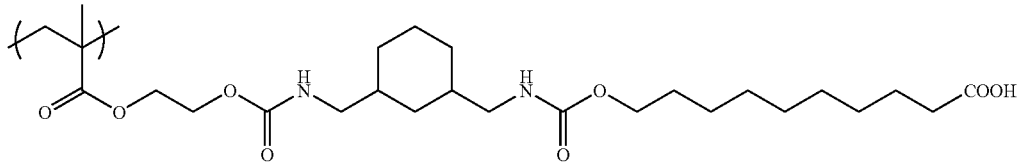

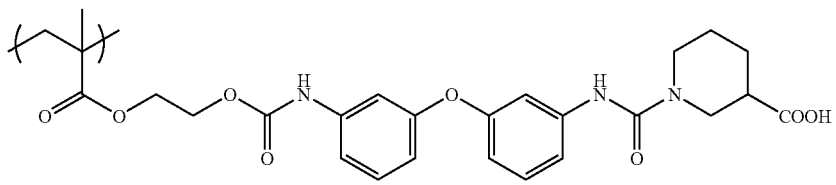

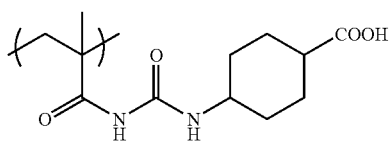
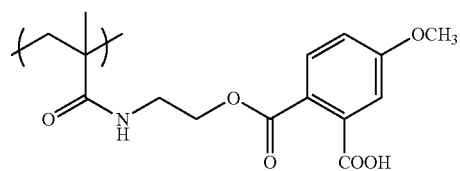

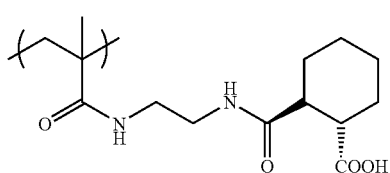
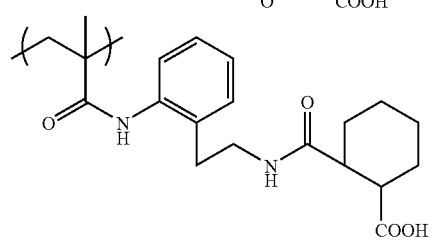

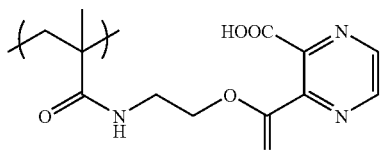
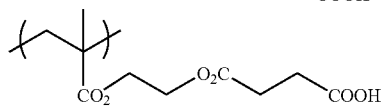

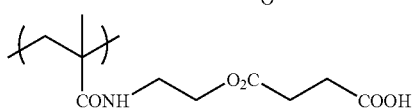
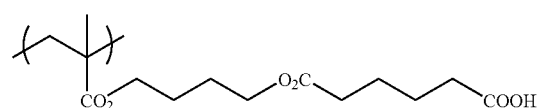

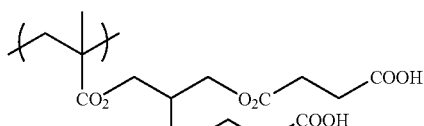
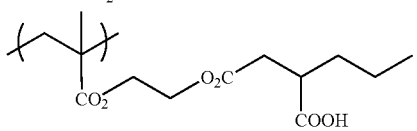

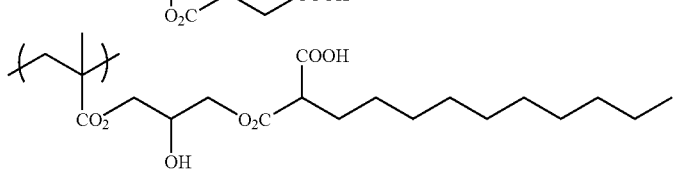

The binder polymer may comprise only one or at least two kinds of repeated units represented by Formula (i). Specific binder polymers used in the present invention may comprise only the repeating units represented by Formula (i), but they are, in general, in the form of copolymers of the foregoing repeating units with units derived from other copolymerizable components. The total content of the repeating units represented by Formula (i) in the copolymer is properly determined while taking into consideration, for instance, the structure of the copolymer and the design of the composition, but the content preferably ranges from 1 to 99 mole %, more preferably 5 to 40 mole % and further preferably 5 to 20 mole % on the basis of the total molar amount of the polymer component.

When the binder polymer used is in the form of a copolymer, the copolymerizable components are not particularly restricted to specific ones and may be any conventionally known one inasmuch as they are radical-polymerizable monomers. Specific examples thereof are monomers disclosed in "Data Handbook of Polymer, Fundamentals, edited by Polymer Society of Japan, published by Baifukan, 1986". The copolymerizable components may be used alone or in any combination of at least two of them.

The molecular weight of the specific binder polymer used in the invention is appropriately selected in consideration of the image-forming ability of the resulting composition and the printing durability of the resulting lithographic printing plate precursor. In general, the higher the molecular weight of the polymer, the higher the printing durability of the precursor, but the image-forming ability is liable to be deteriorated. Contrary to this, the lower the molecular weight of the polymer, the better the image-forming ability, but the printing durability is reduced. Accordingly, the molecular weight of the polymer preferably ranges from 2,000 to 1,000,000, more preferably 5,000 to 500,000 and further preferably 10,000 to 200,000.

The binder polymer used in the invention may comprise such a specific binder polymer alone, but may be a mixture thereof with at least one binder polymer other than the specific one. The content of the binder polymer used simultaneously with the specific one ranges from 1 to 60% by mass, preferably 1 to 40% by mass and further preferably 1 to 20% by mass on the basis of the total mass of the binder polymer component. The binder polymers which can be used simultaneously with the specific one may be any conventionally known one without any restriction and specific examples thereof preferably used herein are binders having acrylic main chains and urethane binders currently used in this field.

The total amount of the specific binder polymer and the additional binder polymer in the composition may properly be selected, but it in general ranges from 10 to 90% by mass, preferably 20 to 80% by mass and more preferably 30 to 70% by mass on the basis of the total mass of the non-volatile components present in the composition.

The acid value (meq/g) of such a binder polymer preferably ranges from 2.00 to 3.60.

<Other Binder Polymers Simultaneously Used Herein>

The other binder polymers capable of being used simultaneous with the specific binder polymers are preferably radical polymerizable group-containing binder polymers. Such a radical polymerizable group is not restricted to specific ones inasmuch as they can be subjected to the radical polymerization, but specific examples thereof include α-substituted methyl acrylate group [—OC(=O)—C(—CH$_2$Z)=CH$_2$, wherein Z represents a hydrocarbon group starting from a hetero atom], acryl, methacryl, allyl and styryl group, with acryl and methacryl groups being preferably used herein.

The amount of the radical polymerizable groups present in the binder polymer (the content of radical polymerizable unsaturated double bonds as determined by the iodometry) preferably ranges from 0.1 to 10.0 mM, more preferably 1.0 to 7.0 mM and most preferably 2.0 to 5.5 mM per unit amount (1 g) of the binder polymer. If the content thereof is lower than 0.1 mM, the resulting composition sometimes shows an insufficient curing ability and the sensitivity thereof is accordingly low. On the other hand, if it exceeds 10.0 mM, the resulting composition often becomes unstable and the storage stability thereof is in turn reduced.

Further, the other binder polymers simultaneously used preferably has an alkali-soluble group. The content (the acid value as determined by the neutralization titration) of the alkali-soluble group in the binder polymer preferably ranges from 0.1 to 3.0 mM, more preferably 0.2 to 2.0 mM and most preferably 0.45 to 1.0 mM per unit amount (1 g) of the binder polymer. If the content thereof is less than 0.1 mM, the binder polymer may often be precipitated in the developer during development to thus generate scum in the developer, while if it exceeds 3.0 mM, the hydrophilicity of the binder polymer is too high and when applied to a lithographic printing plate precursor, the printing durability of the resulting printing plate is sometimes reduced.

The weight average molecular weight of such a binder polymer preferably ranges from 2,000 to 1,000,000, more preferably 10,000 to 300,000 and most preferably 20,000 to 200,000. If the weight average molecular weight thereof is lower than 2,000, the film-forming ability of the resulting composition is often reduced and this in turn results in the formation of a printing plate having insufficient printing durability, while if it exceeds 1,000,000, the polymer is sometimes hardly soluble in a solvent for coating and the composition accordingly has insufficient coating properties.

In addition, the glass transition point (Tg) of such a binder polymer preferably falls within the range of from 70 to 300° C., more preferably 80 to 250° C. and most preferably 90 to 200° C. If the glass transition point thereof is less than 70° C., the resulting composition sometimes has insufficient storage stability and when applied to a lithographic printing plate precursor, the printing durability of the resulting printing plate is correspondingly reduced, while if it exceeds 300° C., the resulting composition sometimes has a low sensitivity because of the reduction in the radical mobility in the composition.

To make the glass transition point of the binder polymer higher, it is preferred to incorporate amide groups and/or imide groups, in particular, those derived from methacrylamide-methacrylamide derivatives into the binder molecule.

The image-recording material used in the invention may further comprise, in addition to the foregoing essential components, other components suitably used depending on the applications thereof and the methods for producing the same according to need. Such additives preferably used herein will be described or exemplified below.

(Polymerization Inhibitors)

It is desirable in the present invention to add a small amount of a heat polymerization inhibitor to the image-forming composition for the inhibition of unnecessary heat polymerization of the polymerizable ethylenically unsaturated double bond-containing compound or the ethylenically unsaturated bond-containing monomer. Examples of heat polymerization inhibitors appropriately used herein are hydroquinone, p-methoxy phenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitrosophenyl hydroxylamine cerous salt. The amount of the heat polymerization inhibitory agent to be added to the composition preferably ranges from about 0.01% by mass to about 5% by mass based on the mass of the non-volatile components present in the composition. Moreover, a higher fatty acid or a derivative thereof such as behenic acid or behenic acid amide can, for instance, be added to the composition to eliminate any polymerization-inhibitory effect of oxygen. Thus, the derivative or the like can locally be distributed in the surface region of the resulting image-recording layer by the action of the drying step after the application of the composition. The amount of the higher fatty acid derivative to be incorporated into the composition preferably ranges from about 0.5% by mass to about 10% by mass on the basis of the mass of the non-volatile components present in the composition.

(Coloring Agents)

The image-forming layer used in the invention may further comprise a dye or a pigment for the coloration of the material. If the layer is used for making a printing plate, the so-called plate-examining properties such as the visibility after the plate-making operations and the image density determination properties of the resulting plate can be improved. When using a dye as a coloring agent, the photopolymerizable image-recording layer frequently shows reduction of sensitivity in most of cases and therefore, a pigment is preferably used as a coloring agent. Specific examples of such coloring agents are pigments such as phthalocyanine pigments, azo pigments, carbon black and titanium oxide; and dyes such as Ethyl Violet, Crystal Violet, azo dyes, anthraquinone dyes and cyanine dyes. The amount of these dyes or pigments as coloring agents to be incorporated into the composition for forming the image-recording layer preferably ranges from about 0.5% by mass to about 5% by mass on the basis of the mass of the non-volatile components present in the composition.

(Other Additives)

Moreover, the image-forming layer may optionally comprise known additives such as an inorganic filler for improving physical properties of the resulting cured film, other plasticizers and a sensitizing agent (ink-receptivity improver) which can improve the ink-receptivity of the surface of the image-recording layer. Examples of such plasticizers are dioctyl phthalate, didodecyl phthalate, triethylene glycol di-caprylate, dimethyl glycol phthalate, tricresyl phosphate, dioctyl adipate, dibutyl sebacate, and triacetyl glycerin. The plasticizer may be added to the composition usually in an amount of not more than 10% by mass on the basis of the sum of the binder polymer and the ethylenically unsaturated bond-containing monomer. Moreover, in the lithographic printing plate precursor as will be detailed below, it is also possible to add, to the composition, a UV initiator and a thermal crosslinking agent for enhancing the effects of heating and/or light-exposure steps carried out after the development or for the improvement of the film strength (printing durability).

The composition containing the foregoing components can suitably be used for forming the image-recording layer of the image-forming material used in the invention as will be detailed below.

[Image-Forming Material]

The image-forming material used in the invention is one comprising a substrate provided thereon with an image-recording layer. The material may optionally comprise a protective layer on the image-recording layer. The image-recording layer comprises the components described above in detail. Such an image-forming material can be prepared by dissolving, in a solvent, components required for preparing a coating liquid for forming an image-recording layer or components required for preparing a coating liquid for forming a desired layer such as a protective layer and then applying these coating liquids onto an appropriate substrate or an intermediate layer.

[Image-Recording Layer]

The image-recording layer used in the invention is a heat-polymerizable negative-working image-recording layer comprising an infrared light absorber, a sulfonium salt polymerization initiator, an ethylenically unsaturated bond-containing monomer (also referred to as addition-polymerizable compound) and a binder polymer. The image-forming mechanism of such a heat-polymerizable negative-working image-recording layer is as follows: the polymerization initiator is decomposed by the action of heat to thus generate radicals and the radicals thus generated induce the polymerization reaction of the ethylenically unsaturated bond-containing monomer. Moreover, the lithographic printing plate precursor as an image-forming material used in the invention is particularly suitable for use in the direct plate-making method which makes use of laser rays having a wavelength ranging from 760 to 1,200 nm and it would show printing durability and an image-forming ability superior to those observed for the conventional lithographic printing plate precursor.

The foregoing image-recording layer is formed by dissolving the composition comprising the foregoing components for forming the image-recording layer of the invention in a variety of organic solvents and then applying the resulting solution onto a substrate or an intermediate layer. Examples of such solvents used herein are acetone, methyl ethyl ketone, cyclohexane, ethyl acetate, ethylene dichloride, tetrahydrofuran, toluene, ethylene glycol monomethyl ether, ethylene glycol mono-ethyl ether, ethylene glycol dimethyl ether, propylene glycol monomethyl ether, propylene glycol mono-ethyl ether, acetyl-acetone, cyclohexanone, diacetone alcohol, ethylene glycol monomethyl ether acetate, ethylene glycol ethyl ether acetate, ethylene glycol mono-isopropyl ether, ethylene glycol mono-butyl ether acetate, 3-methoxypropanol, methoxy-methoxy ethanol, diethylene glycol monomethyl ether, diethylene glycol mono-ethyl ether, diethylene glycol dimethyl ether, diethylene glycol diethyl ether, propylene glycol monomethyl ether acetate, propylene glycol monoethyl ether acetate, 3-methoxy-propyl acetate, N,N-dimethylformamide, dimethylsulfoxide, γ-butyrolactone, methyl lactate and ethyl lactate. These solvents may be used alone or in combination. The concentration of the solid contents in the coating solution suitably ranges from 2 to 50% by mass.

The coated amount of the image-recording layer may mainly have effects upon the sensitivity and developing ability of the image-recording layer, and the strength and printing durability of the exposed film and accordingly, it is desirably selected depending on the applications. In this respect, if the coated amount is too small, the exposed film has insufficient printing durability, while if it is too large, the sensitivity of the resulting layer is reduced, it takes a long period of time for the exposure and the development likewise requires a long period of time. Regarding the scanning exposure type lithographic printing plate precursor concerning the principal object of the invention, the coated amount thereof desirably ranges from about 0.1 $g/m^2$ to about 10 $g/m^2$ as expressed in terms of the amount determined after drying. More preferably, it ranges from 0.5 $g/m^2$ to 5 $g/m^2$.

[Substrate]

As the substrate for the image-forming material used in the invention, the substrates conventionally known as hydrophilic substrates currently used in, for instance, the lithographic printing plate precursors may be used without any particular restriction.

The substrate used herein is preferably a plate-like substance having good dimensional stability and examples thereof include paper; paper laminated with plastic films (such as polyethylene, polypropylene and polystyrene films); metal plates (such as aluminum, zinc and copper plates); plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal films); and paper and plastic films which are laminated with the foils of the foregoing metals or on which the foregoing metals are deposited. These substrates may, if necessary, be subjected to appropriate known physical and/or chemical surface treatments for the purposes of, for instance, imparting hydrophilicity to the surface and/or improving the strength thereof.

Examples of substrates particularly preferably used herein are paper, a polyester film and an aluminum plate. Among them, the aluminum plate may further preferably be used since it is excellent in the dimensional stability, it is relatively cheap and those excellent in the hydrophilicity and strength can easily be obtained by desired surface treatments. Examples of substrates likewise preferably used herein include composite sheets each comprising a polyethylene terephthalate film and an aluminum sheet adhered thereto such as those disclosed in J.P. KOKOKU Sho 48-18327.

The aluminum plate used herein means a metal plate comprising dimensionally stable aluminum as a principal component and the plate can be selected from the group consisting of a pure aluminum plate, a plate of an alloy comprising aluminum as a main component and trace amounts of foreign elements, and a plastic film or paper which comprises an aluminum (or an alloy thereof) foil or layer laminated with or deposited on the same. In the following description, the foregoing substrates consisting of aluminum or aluminum alloys are hereunder generically referred to as "aluminum substrate(s)". The foreign elements included in the foregoing aluminum alloys are, for instance, silicon, iron, manganese, copper, magnesium, chromium, zinc, bismuth, nickel and titanium and the total content of these foreign elements in the alloy is not more than 10% by mass. In the present invention, the use of a pure aluminum substrate is preferred, but aluminum substrates each containing a trace amount of foreign elements may likewise suitably be used herein since it is difficult to produce completely pure aluminum due to the limit of the refining technique. Thus, the aluminum plate used in the present invention is not limited in its composition and usable herein include, for instance, those prepared from conventionally known and currently used materials such as JIS A 1050, JIS A 1100, JIS A 3103 and JIS A 3005.

The thickness of the aluminum substrate used in the invention is on the order of about 0.1 to 0.6 mm. The thickness can arbitrarily be changed depending on the size of a printing press used, the size of the finally prepared printing plate and the requirements of users. The aluminum substrate may if necessary be subjected to the following surface-treatments. It is a matter of course that these surface-treatments are not essential in the present invention.

(Surface-Roughening Treatment)

When using a surface-roughened substrate, examples of such surface-roughening treatments are mechanical surface-roughening, chemical etching and electrolytic graining treatments such as those disclosed in J.P. KOKAI Sho 56-28893. Examples of surface-roughening treatments usable herein also include an electrochemical surface-roughening treatment wherein an aluminum substrate is electrochemically surface-roughened in an electrolyte such as a hydrochloric acid or nitric acid solution; and mechanical surface-roughening methods such as a wire brush-graining method in which the aluminum surface is scratched with metal wires, a ball graining method in which the aluminum surface is grained with abrasive spheres and an abrasive and a brush graining method wherein the aluminum surface is roughened using a nylon brush and an abrasive. The foregoing surface-roughening methods can be used alone or in any combination. Among them, preferably used herein is the electrochemical surface-roughening treatment wherein an aluminum substrate is electrochemically surface-roughened in a hydrochloric acid or nitric acid solution as an electrolyte and in this case, a suitable anode time electricity is in the range of from 50 to 400 $C/dm^2$. More specifically, an aluminum substrate is subjected to alternating and/or direct current electrolyzation carried out in an electrolyte containing 0.1 to 50% hydrochloric acid or nitric acid under the following conditions: a temperature ranging from 20 to 80° C.; an electrolyzation time ranging from one second to 30 minutes; and a current density ranging from 100 to 400 $C/dm^2$.

The aluminum substrate thus surface-roughened may be chemically etched with an acid or an alkali. Examples of etching agents suitably used herein are sodium hydroxide, sodium carbonate, sodium aluminate, sodium meta-silicate, sodium phosphate, potassium hydroxide and lithium hydroxide and the preferred concentration of such an etching agent and the preferred etching temperature range from 1 to 50% and 20 to 100° C., respectively. The aluminum substrate is then washed with an acid for the removal of contaminants (smut) remaining on the surface after the etching treatment. Acids usable herein are, for instance, nitric acid, sulfuric acid, phosphoric acid, chromic acid, hydrofluoric acid, borofluoric acid. Particularly preferred methods for removing smut after the electrochemical surface-roughening treatment include, for instance, a method comprising bringing the aluminum substrate into contact with a 15 to 65% by mass sulfuric acid solution maintained at a temperature ranging from 50 to 90° C. disclosed in J.P. KOKAI Sho 53-12739 and a method comprising etching the aluminum substrate with an alkali disclosed in J.P. KOKOKU Sho 48-28123. The methods and conditions of these treatments are not particularly restricted to specific ones inasmuch as the central line-average surface roughness Ra falls within the range of from 0.2 to 0.5 μm after the foregoing treatments of the substrate.

(Anodization Treatment)

The aluminum substrate on which an oxide layer is formed by the foregoing treatments may further be subjected to anodization, if necessary.

The anodization treatment employs an aqueous solution of sulfuric acid, phosphoric acid, oxalic acid or boric acid/sodium borate or any combination of a plurality thereof as a principal component of the electrolytic bath. In this respect, the electrolyte may of course comprise components usually included in, for instance, at least an Al alloy plate, electrodes, tap water and underground water. Moreover, it may further comprise second and third components. The term "second and third components" herein used means, for instance, metal ions such as Na, K, Mg, Li, Ca, Ti, Al, V, Cr, Mn, Fe, Co, Ni, Cu and Zn ions; cations such as ammonium ions; and anions such as nitrate ions, carbonate ions, chloride ions, phosphate ions, fluoride ions, sulfite ions, titanate ions, silicate ions and borate ions and the concentration thereof ranges from about 0 to 10000 ppm. The conditions for the anodization are not particularly restricted, but the aluminum substrate is treated according to the alternating or direct current electrolyzation carried out at an electrolyte concentration ranging from 30 to 500 g/L; an electrolyte temperature ranging from 10 to 70° C.; and a current density ranging from 0.1 to 40 $A/m^2$. The thickness of the anodized layer thus formed ranges from 0.5 to 1.5 μm and preferably 0.5 to 1.0 μm. The conditions for the anodization treatment can appropriately be selected in such a manner that the substrate has micropores in the anodized layer thereof and that the pore size and pore density fall within the ranges of from 5 to 10 nm and $8\times10^{15}$ to $2\times10^{16}/m^2$, respectively.

The surface of the foregoing substrate may be hydrophilized by a wide variety of known methods. A particularly preferred hydrophilization treatment is carried out using, for instance, a silicate or a polyvinyl phosphonic acid. The hydrophilization layer is formed in an amount ranging from 2 to 40 mg/m$^2$ and more preferably 4 to 30 mg/m$^2$ as expressed in terms of the amount of Si or P element. The amount of the layer can be determined by the fluorescent X-ray analysis.

More specifically, the foregoing hydrophilization treatment is carried out by immersing the aluminum substrate, on which an anodized layer is formed, in an aqueous solution containing 1 to 30% by mass, preferably 2 to 15% by mass of an alkali metal silicate or a polyvinyl phosphonic acid and having a pH as determined at 25° C. ranging from 10 to 13, for instance, at a temperature ranging from 15 to 80° C. for 0.5 to 120 seconds.

The alkali metal silicate used in the foregoing hydrophilization treatment may be, for instance, sodium silicate, potassium silicate and lithium silicate. Examples of hydroxides used for controlling the pH value of the aqueous alkali metal silicate solution are sodium hydroxide, potassium hydroxide and lithium hydroxide. In this respect, the foregoing treating solution may additionally comprise an alkaline earth metal salt or a salt of a Group IVB metal. Examples of such alkaline earth metal salts are nitrates such as calcium nitrate, strontium nitrate, magnesium nitrate and barium nitrate; and water-soluble salts such as sulfates, chlorides, phosphates, acetates, oxalates and borates. Examples of salts of Group IVB metals are titanium tetrachloride, titanium tri-chloride, potassium titanium fluoride, potassium titanium oxalate, titanium sulfate, titanium tetraiodide, zirconium oxychloride, zirconium dioxide, zirconium oxychloride and zirconium tetrachloride.

The alkaline earth metal salts and salts of Group IVB metals may be used alone or in any combination of at least two of them and the amount of these metal salts used in the treating solution preferably ranges from 0.01 to 10% by mass and more preferably 0.05 to 5.0% by mass. Moreover, it is also effective to use the silicate electrodeposition as disclosed in U.S. Pat. No. 3,658,662. It is likewise effective to combine the electrolytically grained substrate disclosed in J.P. KOKOKU Sho 46-27481 and J.P. KOKAI Nos. Sho 52-58602 and Sho 52-30503 with the combination comprising the foregoing anodization and hydrophilization treatments.

In addition, the image-forming material used in the invention may additionally comprise an intermediate layer between the substrate and the image-recording layer in order to improve the adhesion between them and the resistance to staining thereof. Specific examples of such intermediate layers suitably used herein are those disclosed in the following publications: J.P. KOKOKU Sho 50-7481; J.P. KOKAI Nos. Sho 54-72104, Sho 59-101651, Sho 60-149491, Sho 60-232998, Hei 3-56177, Hei 4-282637, Hei 5-16558, Hei 5-246171, Hei 7-159983, Hei 7-314937, Hei 8-202025, Hei 8-320551, Hei 9-34104, Hei 9-236911, Hei 9-269593, Hei 10-69092, Hei 10-115931, Hei 10-161317, Hei 10-260536, Hei 10-282682, Hei 11-84674, Hei 11-38635, Hei 11-38629, Hei 10-282645, Hei 10-301262, Hei 11-24277, Hei 11-109641, Hei 10-319600, Hei 11-84674, Hei 11-327152, 2000-10292, 2000-235254, 2000-352824, 2001-175001 and 2001-209170.

[Protective Layer (Overcoat Layer)]

In the present invention, a protective layer may be formed on the image-recording layer. The protective layer is fundamentally formed to protect the light-sensitive layer, but it also plays a role of an oxygen barrier layer when the image-recording mechanism of the light-sensitive layer includes radical polymerization as in the present invention, and the protective layer likewise serves as an ablation-inhibitory layer when the image-recording layer is exposed to an infrared laser beam having a high luminous intensity.

In addition to the foregoing characteristics, the protective layer should desirably satisfy the following requirements: it should never inhibit the substantial transmission of the light rays used for the exposure; it should be excellent in the adhesion to the light-sensitive layer; and it can easily be removed in the developing step after the exposure step. Regarding such an intermediate layer, there have variously been devised and the details thereof are disclosed in U.S. Pat. No. 3,458,311 and J.P. KOKOKU Sho 55-49729.

Materials preferably used for preparing such an intermediate layer are, for instance, water-soluble polymeric compounds relatively excellent in the crystallinity and specific examples thereof are water-soluble polymers such as polyvinyl alcohol, vinyl alcohol-vinyl phthalate copolymer, vinyl acetate-vinyl alcohol-vinyl phthalate copolymer, vinyl acetate-crotonic acid copolymer, polyvinyl pyrrolidone, acidic celluloses, gelatin, gum Arabic, poly(acrylic acid) and poly(acrylamide), which may be used alone or in any combination. The use of polyvinyl alcohol as a principal component, among others, would provide best results concerning the fundamental characteristics such as the oxygen barrier properties and the ability of being easily removed during development.

The polyvinyl alcohol used in the protective layer may be partially replaced with esters, ethers and acetals inasmuch as it comprises unsubstituted vinyl alcohol units required for imparting the desired oxygen-barrier properties and water-solubility to the protective layer. In addition, it may likewise partially comprise other copolymerizable components.

Examples of such polyvinyl alcohols are those which are hydrolyzed in a rate of 71 to 100% and whose number of polymerized repeating units falls within the range of from 300 to 2400. Specific examples thereof are those available from Kuraray Co., Ltd. such as PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8.

The components of the protective layer (such as the selection of PVA, and the use of additives), the coated amount thereof or the like can be selected while taking into consideration a variety of requirements such as the desired oxygen-barrier properties and the ability of the layer to be removed during development as well as the fogging properties, adhesion properties and resistance to scratches. Generally, the higher the rate of PVA-hydrolyzation (the higher the content of the unsubstituted vinyl alcohol units present in the oxygen-barrier layer) and the greater the thickness of the protective layer, the higher the resulting oxygen-barrier properties and accordingly, this is advantageous to the sensitivity of the resulting image-recording material. However, if the oxygen-barrier properties are extremely enhanced, various problems arise such that the resulting image-recording material may sometimes undergo an unnecessary polymerization reaction during its preparation or the storage thereof in its green state (or in the un-exposed condition) and that there are observed unnecessary fogging and thickening of printing images upon the imagewise exposure of the material.

For this reason, the oxygen permeability A of the protective layer as determined at 25° C. and 1 atm preferably falls within the following range: $0.2 \leq A \leq 20$ (cc/m$^2$·day).

The molecular weight of the (co)polymer such as the foregoing polyvinyl alcohol (PVA) usable herein desirably ranges from 2000 to 10,000,000 and preferably 20,000 to 3,000,000.

The composition for preparing such a protective layer may likewise comprise, in addition to the foregoing components, for instance, glycerin or di-propylene glycol in an amount of several percents by mass based on the mass of the (co)polymer to thus impart flexibility to the resulting protective layer. Alternatively, the composition may also comprise an anionic surfactant such as sodium alkyl-sulfate and sodium alkyl-sulfonate; an amphoteric surfactant such as a salt of alkylamino-carboxylic acid or alkylamino-dicarboxylic acid; or a nonionic surfactant such as polyoxyethylene alkylphenyl ether in an amount of several percents by mass based on the mass of the (co)polymer.

The thickness of the protective layer suitably ranges from 0.5 to 51 μm and, in particular, 0.5 to 2 μm.

Moreover, the characteristics of the protective layer such as adhesion properties and resistance to scratches are likewise quite important in the handling of the image-forming plate. More specifically, when a hydrophilic layer consisting of a water-soluble polymer is formed on a lipophilic polymerizable layer, the former is liable to undergo peeling off because of insufficient adhesion between them and defects such as insufficient curing of the film are caused due to the polymerization-inhibitory effect of oxygen within the area from which the hydrophilic layer has been peeled off. For this end, there have been proposed a variety of techniques to improve the adhesion between these two layers. For instance, U.S. patent application Ser. Nos. 292,501 and 44,563 disclose that the desired satisfactory adhesion between these two layers can be ensured by incorporating an acrylic emulsion or a water-insoluble vinyl pyrrolidone-vinyl acetate copolymer into a hydrophilic polymer mainly comprising a polyvinyl alcohol in an amount ranging from 20 to 60% by mass and then applying the resulting mixture onto the polymerizable layer. All of these known techniques can be applied to the protective layer used in the present invention. Such a method for coating a protective layer is disclosed in, for instance, U.S. Pat. No. 3,458,311 and J.P. KOKOKU Sho 55-49729.

The image-forming method of the invention includes an imagewise exposure step and a developing step of the image-recording layer.

An infrared laser may be a light source suitably used in the invention for exposing the image-recording layer and images can likewise thermally be recorded on the image-recording layer using a UV lamp or a thermal head.

Among these, it is preferred in the invention that the image-recording layer is imagewise exposed to light using a solid state laser or a semiconductor laser emitting infrared rays whose wavelengths fall within the range of from 750 to 1400 nm. The output of the laser is preferably not less than 100 mW and it is also preferred to use a multi-beam laser device in order to shorten the exposure time. Moreover, the exposure time per picture element is preferably not more than 20 μsec. The energy required for the irradiation of the lithographic printing plate precursor preferably ranges from 10 to 300 mJ/cm$^2$. If the energy for the exposure is too weak, the image-recording layer is never sufficiently cured. On the other hand, if it is too strong, the image-recording layer is subjected to laser ablation and the images may thus be damaged.

In the present invention, the imagewise exposure may be carried out by making light beams from light sources overlap with one another. The term "overlap" herein used means that the secondary scanning pitch width is smaller than the beam diameter. When the beam diameter is expressed in terms of the half band width of the beam strength (FWHM), the degree of such overlap can quantitatively be defined by FWHM/ the secondary scanning pitch width (overlap coefficient). In the present invention, this overlap coefficient is preferably not less than 0.1.

The scanning system for the light source of the exposure device used in the invention is not particularly restricted and may be, for instance, the drum external surface scanning system, the drum inner face scanning system and the flat-bed scanning system. Moreover, the light source may be a mono-channel or multi-channel type one, but a multi-channel type one is preferably used, in case of the drum external surface scanning system.

In the present invention, the image-forming material may be developed immediately after the imagewise exposure, but the material may be heat-treated between the exposure and developing steps. This heat-treatment is preferably carried out at a temperature ranging from 60 to 150° C. for 5 seconds to 5 minutes.

The foregoing heat-treatment can appropriately be selected from a variety of known methods. Specific examples thereof include a method comprising heating the image-forming material while bringing the material into contact with a panel heater or a ceramic heater and a non-contact heating method using a lamp or hot air. The use of the foregoing heat-treatment would permit the reduction of the quantity of the laser energy required for irradiating the material with laser rays to thus record images on the material.

Moreover, the method of the invention may likewise comprise preliminary water-washing step prior to the developing step to thus remove the protective layer. Tap water is, for instance, used in the preliminary water-washing step.

Then the lithographic printing plate precursor thus developed may be subjected to various post-treatments such as washing with water, and treatments with a rinsing liquid containing, for instance, a surfactant and/or with a desensitizing gum solution containing, for instance, gum Arabic or a starch derivative, as disclosed in, for instance, J.P. KOKAI Nos. Sho 54-8002, Sho 55-115045 and Sho 59-58431. The post-treatment of the image-forming material of the invention may comprise a variety of combinations thereof.

In the image-forming method of the invention, it is quite effective to heat the entire surface of the image-forming material after the development or to subject the entire surface of the material to light exposure.

The heat-treatment after the development may be carried out under quire severe conditions. The treatment is in general conducted at a heating temperature ranging from 200 to 500° C. If the heating temperature after the development is low, it is not possible to enjoy a sufficient image-reinforcing effect, while if it is too high, problems may arise such that the substrate is deteriorated and that the image areas may be thermally decomposed.

If the image-forming material of the present invention is a lithographic printing plate precursor, the lithographic printing plate prepared by the foregoing treatments is fitted to an offset printing press and used for preparing a large number of printed matters. A plate cleaner may be used during printing operations for the removal of any contaminant on the printing plate. Such a plate cleaner usable herein may be any conventionally known one for PS (pre-sensitized) plates, for instance, those available from Fuji Photo Film Co., Ltd. such as CL-1, CL-2, CP, CN-4, CN, CG-1, PC-1, SR and IC.

EXAMPLES

The image-forming method according to the present invention which makes use of a lithographic printing plate precursor as an image-forming material will hereunder be described in more detail with reference to the following Examples, but the present invention is not restricted to these specific Examples at all.

Examples 1 to 11 and Comparative Example 1

[Preparation of Substrate]

<Aluminum Plate>

A molten metal was prepared using an aluminum alloy comprising Si: 0.06% by mass, Fe: 0.30% by mass, Cu: 0.001% by mass, Mn: 0.001% by mass, Mg: 0.001% by mass, Zn: 0.001% by mass, Ti: 0.03% by mass and the balance of Al and inevitable impurities, followed by the treatment and filtration of the molten metal and subsequent preparation of an ingot having a thickness of 500 mm and a width of 1200 mm according to the DC casting method. After scraping the surface of the ingot in an average thickness of 10 mm using a facing device, the ingot was subjected to soaking at 550° C. for about 5 hours and it was formed into a rolled sheet having a thickness of 2.7 mm in a hot rolling mill when the temperature of the ingot was reduced to 400° C. Further, the rolled sheet was heat-treated at 500° C. using a continuous annealing machine and then processed into a sheet having a thickness of 0.24 mm according to the cold rolling to thus give an aluminum plate satisfying the requirements for JIS 1050 Material. The width of the resulting aluminum plate was adjusted to 1030 mm and then subjected to the following surface-treatments.

<Surface-Treatments>

The surface-treatment was conducted by continuously carrying out the various kinds of treatments (a) to (j) specified below. In this respect, the aluminum plate was subjected to liquid-drainage using a nip roller after each treatment and water-washing.

(a) Mechanical Surface-Graining Treatment

The aluminum plate was mechanically surface-roughened using a rotating roller-like nylon brush, while supplying a suspension comprising water and an abrasive (pumice stone) having a specific gravity of 1.12 as an abrasion slurry onto the surface of the plate. The average and maximum particle sizes of the abrasive were found to be 30 µm and 100 µm, respectively. The nylon brush was produced from 6/10 nylon and the length and diameter of the bristles thereof were found to be 45 mm and 0.3 mm, respectively. The nylon brush was prepared by making holes on a stainless steel cylinder having a diameter φ of 300 mm and densely planting such bristles in the cylinder. Three such rotating brushes were used in this Example. The distance between two support rolls (φ:200 mm) below the brushes was set at a level of 300 mm. The roller brushes were pressed against the aluminum plate in such a manner that the load of the driving motor for rotating the brushes was equal to a level of 7 kW higher than that observed when the brushes were not pressed against the plate. The rotational direction of the brushes was identical to the moving direction of the aluminum plate. The rotational number of the brushes was set at 200 rpm.

(b) Alkali-Etching Treatment

The aluminum plate thus treated was then subjected to an etching treatment by spraying the plate with an aqueous solution containing 2.6% by mass of caustic soda and 6.5% by mass of aluminum ions and maintained at 70° C. for the dissolution of 10 g/m$^2$ of aluminum. Subsequently, the plate was washed with water by spraying.

(c) Desmutting Treatment

The aluminum plate was desmutted by spraying the plate with an aqueous nitric acid solution having a concentration of 1% by mass (containing 0.5% by mass of aluminum ions) at a temperature of 30° C. and then the plate was washed with water by spraying. The nitric acid aqueous solution used in the desmutting treatment was the waste liquor generated in the step of the electrochemical surface-roughening treatment using an alternating current in a nitric acid aqueous solution.

(d) Electrochemical Surface-Roughening Treatment

The aluminum plate was subjected to a continuous electrochemical surface-roughening treatment using an AC voltage of 60 Hz. The electrolyte used in this treatment was an aqueous solution containing 10.5 g/L of nitric acid (containing 5 g/L of aluminum ions and 0.007% by mass of ammonium ions) and having a temperature of 50° C. The electrochemical surface-roughening treatment was carried out using a trapezoidal rectangular waved alternating current whose TP or the time required for achieving the peak current value starting from zero current was 0.8 msec and a duty ratio of 1:1 as the wave form of the alternating power source and a carbon electrode as a counter electrode. A ferrite electrode was used as a secondary anode.

The current density was found to be 30 A/dm$^2$ at the peak current and the electricity was found to be 220 C/dm$^2$ as expressed in terms of the total anode time electricity of the aluminum plate. To the secondary anode, 5% of the current supplied from the power source was branched. Thereafter, the plate was washed with water through spraying.

(e) Alkali-Etching Treatment

The aluminum plate was etched through spraying at 32° C. using an aqueous solution containing 26% by mass of caustic soda and 6.5% by mass of aluminum ions to thus dissolve the aluminum plate in an amount of 0.50 g/m$^2$, followed by the removal of the smut components mainly comprising aluminum hydroxide generated during the preceding electrochemical surface-roughening treatment (d) using an alternating current and the dissolution of the edge portions of pits formed during the step to thus make the edge portions smooth. Thereafter, the plate was washed with water through spraying.

(f) Desmutting Treatment

The aluminum plate thus treated was desmutted at 30° C. by spraying an aqueous solution (containing 4.5% by mass of aluminum ions) having a nitric acid concentration of 15% by mass and thereafter, it was washed with water through spraying. The nitric acid solution used in this desmutting treatment was the waste liquor generated in the step of the electrochemical surface-roughening treatment using an alternating current in a nitric acid aqueous solution.

(g) Electrochemical Surface-Roughening Treatment

The aluminum plate was subjected to a continuous electrochemical surface-roughening treatment using an AC voltage of 60 Hz. The electrolyte used in this treatment was an aqueous solution containing 5.0 g/L of hydrochloric acid (containing 5 g/L of aluminum ions) and having a temperature of 35° C. The electrochemical surface-roughening treatment was carried out using a trapezoidal rectangular waved alternating current whose TP or the time required for achieving the peak current value starting from zero current was 0.8 msec and a duty ratio of 1:1 as the wave form of the alternating power source and a carbon electrode as a counter electrode. A ferrite electrode was used as a secondary anode.

The current density was found to be 25 A/dm$^2$ at the peak current and the electricity was found to be 50 C/dm$^2$ as expressed in terms of the total anode time electricity of the aluminum plate. Thereafter, the plate was washed with water through spraying.

(h) Alkali-Etching Treatment

The aluminum plate was etched through spraying at 32° C. using an aqueous solution containing 26% by mass of caustic soda and 6.5% by mass of aluminum ions to thus dissolve the aluminum plate in an amount of 0.10 g/m$^2$, followed by the removal of the smut components mainly comprising aluminum hydroxide generated during the preceding electrochemical surface-roughening treatment (g) using an alternating current and the dissolution of the edge portions of pits formed during the step to thus make the edge portions smooth. Thereafter, the plate was washed with water through spraying.

(i) Desmutting Treatment

The aluminum plate thus treated was desmutted at 60° C. by spraying an aqueous solution (containing 0.5% by mass of aluminum ions) having a sulfuric acid concentration of 25% by mass and thereafter, it was washed with water through spraying.

(j) Anodization Treatment

Then the aluminum plate was anodized using an anodization device to thus give a substrate for lithographic printing plate. Sulfuric acid solutions were used as electrolytes supplied to a first and second electrolyzation zones. Both of these electrolytes had a sulfuric acid concentration of 170 g/L (containing 0.5% by mass of aluminum ions) and they were maintained at 38° C. Thereafter, the plate was washed with water through spraying. The amount of the anodized film ultimately formed was found to be 2.7 g/m$^2$.

The Ra value of the substrate thus obtained after the foregoing treatments was found to be 0.45.

[Under Coat]

Then the following under coat liquid was applied onto the aluminum substrate using a wire bar and the liquid thus applied was dried at 90° C. for 30 seconds in a warm air dryer. The coated amount determined after drying was found to be 10 mg/m$^2$.

| <Under Coat Liquid> | |
| --- | --- |
| Ethyl acrylate/sodium 2-acrylamide-2-methyl-1-propanesulfonate (molar ratio: 75/15) copolymer | 0.1 g |
| 2-Aminoethyl-phosphonic acid | 0.1 g |
| Methanol | 50 g |
| Deionized water | 50 g |

[Image-Recording Layer]

Then the following coating liquid [P-1] for forming an image-recording layer was prepared and applied onto the aluminum substrate provided with the under coat using a wire bar coater. The liquid thus applied was dried at 122° C. for 43.5 seconds in a warm air dryer to thus form an image-recording layer. The coated amount thereof determined after drying was found to be 1.4 g/m$^2$.

| <Liquid [P-1] for Image-Recording Layer> | |
| --- | --- |
| Infrared light absorber (IR-1) | 0.08 g |
| Polymerization initiator (OS-1) | 0.25 g |
| Di-pentaerythritol hexa-acrylate | 1.00 g |
| Binder polymer (BT-1) | 1.00 g |
| Chloride salt of Ethyl Violet | 0.04 g |
| Fluorine atom-containing surfactant (Megafac F-780-F available from Dainippon Ink and Chemicals, Inc.) | 0.03 g |
| Methyl ethyl ketone | 10.4 g |
| Methanol | 4.83 g |
| 1-Methoxy-2-propanol | 10.4 g |

The following are structural formulas of the infrared light absorber (IR-1), polymerization initiator (OS-1) and binder polymer (BT-1) used in the foregoing coating liquid for forming the image-recording layer:

Infrared Light Absorber (IR-1)

Polymerization Initiator (OS-1)

Binder Polymer (BT-1)

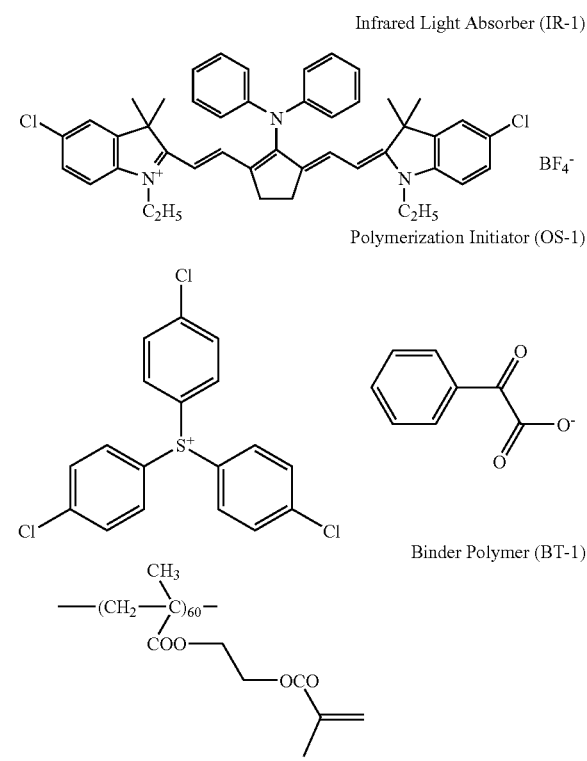

-continued

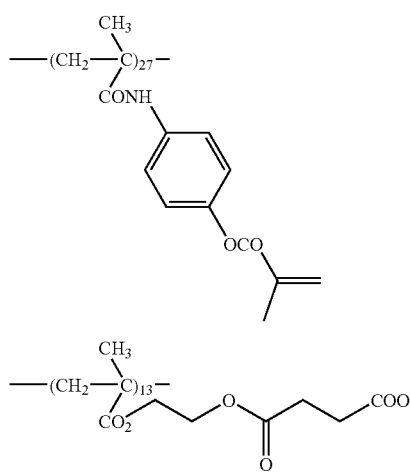

[Protective Layer (Overcoat Layer)]

A mixed aqueous solution containing polyvinyl alcohol (degree of saponification: 98 mole %; degree of polymerization: 500) and polyvinyl pyrrolidone (PVP K-30 available from BASF Company) was coated on the surface of the foregoing image-recording layer using a wire bar coater and dried at 125° C. for 75 seconds in a warm air dryer. The content of the PVA in the aqueous solution was set at 85% by mass and the coated amount of the solution (as determined after drying) was found to be 2.45 g/m$^2$.

<Developer>

The following components were dissolved in water to prepare each corresponding developer: A mol/L of a carbonate; B mol/L of a bicarbonate (A+B=a mole/L); C g/L of a surfactant; D g/L of a silicate (SiO$_2$ component: b mole/L); 1 g/L of 2,4,7,9-tetramethyl-5-decyne-diol; and 2 g/L of tetra-sodium ethylenediamine-tetra-acetate (a chelating agent).

| Dev. No. | Carbonate | A mol/L | Bi-carbonate | B mol/L | a: (A + B) mol/L | Silicate |
|---|---|---|---|---|---|---|
| 1 | K$_2$CO$_3$ | 0.06 | KHCO$_3$ | 0.02 | 0.08 | JIS A potassium silicate |
| 2 | K$_2$CO$_3$ | 0.15 | KHCO$_3$ | 0.04 | 0.19 | JIS A potassium silicate |
| 3 | K$_2$CO$_3$ | 0.3 | KHCO$_3$ | 0.067 | 0.367 | JIS A potassium silicate |
| 4 | K$_2$CO$_3$ | 0.15 | KHCO$_3$ | 0.04 | 0.19 | JIS A potassium silicate |
| 5 | K$_2$CO$_3$ | 0.15 | KHCO$_3$ | 0.04 | 0.19 | JIS A potassium silicate |
| 6 | K$_2$CO$_3$ | 0.15 | KHCO$_3$ | 0.04 | 0.19 | JIS A potassium silicate |
| 7 | Na$_2$CO$_3$ | 0.32 | NaHCO$_3$ | 0.08 | 0.4 | JIS A potassium silicate |
| 8 | K$_2$CO$_3$ | 0.15 | KHCO$_3$ | 0.04 | 0.19 | JIS A potassium silicate |
| 9 | K$_2$CO$_3$ | 0.15 | KHCO$_3$ | 0.04 | 0.19 | JIS A potassium silicate |
| 10 | K$_2$CO$_3$ | 0.15 | KHCO$_3$ | 0.04 | 0.19 | JIS A potassium silicate |
| 11 | K$_2$CO$_3$ | 0.15 | KHCO$_3$ | 0.04 | 0.19 | JIS A potassium silicate |
| 12 | K$_2$CO$_3$ | 0.15 | KHCO$_3$ | 0.04 | 0.19 | JIS A potassium silicate |
| 13 | K$_2$CO$_3$ | 0.15 | KHCO$_3$ | 0.04 | 0.19 | JIS 2 K potassium silicate |
| 14* | K$_2$CO$_3$ | 0.06 | KHCO$_3$ | 0.02 | 0.08 | — |
| 15* | K$_2$CO$_3$ | 0.65 | KHCO$_3$ | 0.15 | 0.8 | — |
| 16* | K$_2$CO$_3$ | 0.15 | KHCO$_3$ | 0.04 | 0.19 | JIS A potassium silicate |
| 17* | K$_2$CO$_3$ | 0.15 | KHCO$_3$ | 0.04 | 0.19 | JIS A potassium silicate |
| 18* | K$_2$CO$_3$ | 0.65 | KHCO$_3$ | 0.65 | 1.3 | JIS A potassium silicate |
| 19* | KOH | 0.1 | — | — | — | — |
| 20* | KOH | 0.0001 | — | — | — | — |

| Dev. No. | SiO$_2$ content g/L | b mol/L | a + b mol/L | a:b | Surfactant | wt % | pH [25° C.] | Electrical conductivity [25° C., mS] |
|---|---|---|---|---|---|---|---|---|
| 1 | 30 | 0.13 | 0.21 | 1:1.6 | II-13 | 5 | 10.7 | 34.4 |
| 2 | 30 | 0.13 | 0.32 | 1:0.7 | II-13 | 5 | 10.8 | 43.5 |
| 3 | 30 | 0.13 | 0.497 | 1:0.35 | II-13 | 5 | 10.7 | 75.2 |
| 4 | 15 | 0.065 | 0.255 | 1:0.34 | II-13 | 5 | 10.7 | 38.2 |
| 5 | 60 | 0.26 | 0.45 | 1:1.39 | II-13 | 5 | 10.9 | 68.1 |
| 6 | 80 | 0.35 | 0.54 | 1:1.8 | II-13 | 5 | 10.9 | 81.8 |
| 7 | 30 | 0.13 | 0.53 | 1:0.33 | II-13 | 5 | 10.3 | 71.4 |
| 8 | 30 | 0.13 | 0.32 | 1:0.7 | II-13 | 2 | 10.7 | 41 |
| 9 | 30 | 0.13 | 0.32 | 1:0.7 | II-13 | 8 | 10.7 | 44.4 |
| 10 | 30 | 0.13 | 0.32 | 1:0.7 | Y-1 | 2 | 10.7 | 40.5 |
| 11 | 30 | 0.13 | 0.32 | 1:0.7 | Y-1 | 5 | 10.7 | 38.8 |
| 12 | 30 | 0.13 | 0.32 | 1:0.7 | Y-1 | 8 | 10.8 | 36.2 |
| 13 | 30 | 0.098 | 0.288 | 1:0.52 | II-13 | 5 | 9.1 | 34.5 |
| 14* | — | — | 0.08 | — | II-13 | 5 | 10.3 | 21.1 |
| 15* | — | — | 0.8 | — | II-13 | 5 | 10.2 | 108.1 |
| 16* | 120 | 0.52 | 0.71 | 1:2.7 | II-13 | 5 | 10.7 | 115.2 |
| 17* | 10 | 0.043 | 0.233 | 1:0.22 | II-13 | 5 | 10.6 | 28.4 |
| 18* | 180 | 0.78 | 2.08 | 1:0.6 | II-13 | 11 | 10.2 | 148.5 |
| 19* | — | — | — | — | II-13 | 5 | 13 | 35.1 |
| 20* | — | — | — | — | II-13 | 5 | 10.2 | 6.6 |

*Comparative Developer

[Evaluation]

The developing rate of non-image areas with an alkaline developer was determined as an indication for the evaluation of the developing ability and the penetration rate of the alkaline developer into the image-recording layer was likewise determined as an indication for the evaluation of the printing durability.

The methods for determining the "developing rate of non-image areas with an alkaline developer" and the "penetration rate of the alkaline developer into the image-recording layer" used in the invention will be described in detail below.

<Determination of Developing Rate of Non-Image Areas With Alkaline Developer>

The term "developing rate of non-image areas with an alkaline developer" herein used is defined to be the thickness (m) of the image-recording layer (non-image area) divided by the time (sec) required for the development thereof.

The method for determining the developing rate used in the invention comprises, as shown in FIG. 1, immersing a sample which comprised an aluminum substrate provided thereon with an un-exposed image-recording layer in an alkaline developer (30° C.) and inspecting the image-recording layer for the dissolution behavior thereof by a DRM interference spectrophotometer. FIG. 1 shows a schematic diagram for illustrating such a DRM interference spectrophotometer for the determination of the dissolution behavior of the image-recording layer. In the present invention, any change in the film thickness was detected by the interference method using light rays of 640 nm. In case where the dissolution behavior is the development, free of any swelling, from the surface of the image-recording layer, the film thickness is gradually reduced with the elapse of the developing time and a characteristic interference pattern proportional to the thickness can accordingly be obtained. Moreover, in case where the dissolution behavior is the dissolution accompanied by swelling (dissolution with release of film), the thickness of the layer varies due to the penetration of the developer and therefore, there is not observed any definite or clear interference pattern at all.

When the determination is continued under these conditions, the image-recording layer is completely removed and accordingly, the development rate can be determined using the equation specified below on the basis of the time (sec) required for making the film thickness zero (or the time required for the completion of the development) and the thickness of the image-recording layer (μm). Thus, it can be judged as follows: the higher the development rate, the easier the removal of the film with the developer and the better the developing properties of the developer.

Development Rate (of un-exposed area)=[(Thickness (μm) of image-recording layer)/(Time (sec) required for the completion of development)]

To make clear the correspondency between the practical quality and the theoretical one, tests were conducted for examining developing properties of plate materials (see the section concerning the evaluation of developing properties).

<Determination of penetration rate of alkaline developer into image-recording layer>

Moreover, the term "penetration rate of alkaline developer into image-recording layer" herein used is defined to be a value showing the rate of change in the electrostatic capacity (F) observed when the foregoing image-recording layer is formed on an electrically conductive substrate and the resulting assembly is immersed in a developer.

Figure 2:
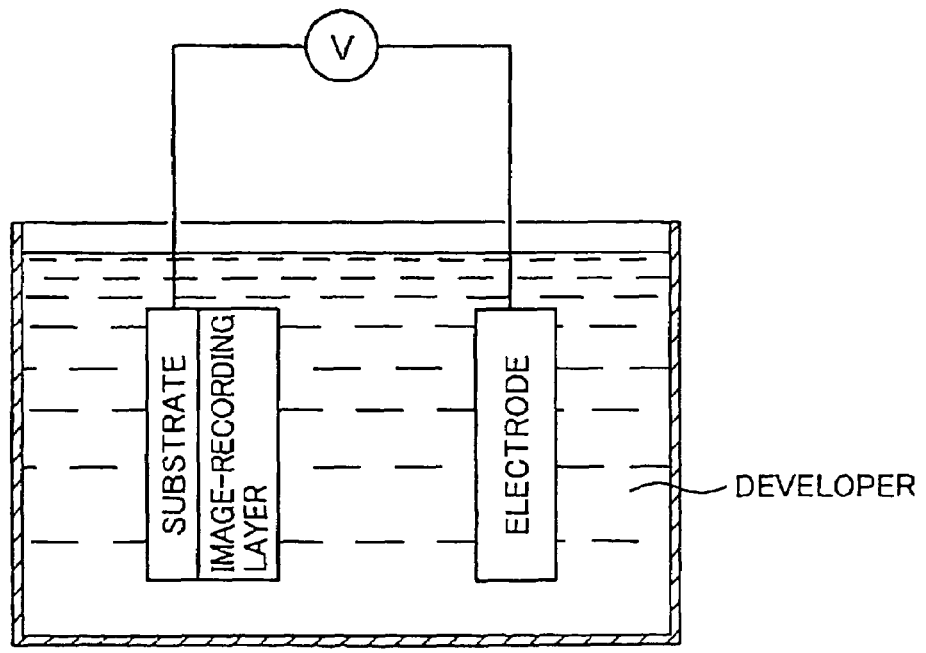
FIG. 2 is a schematic block diagram showing an example of the method for determining the electrostatic capacity used for the evaluation of the penetration characteristics of a developer into an image-recording layer.

An example of the method for determining the electrostatic capacity serving as a tentative criterion for the evaluation of the penetration rate herein used comprises, as shown in FIG. 2, immersing an aluminum substrate serving as an electrode and provided thereon with an exposed (using Trendsetter 3224VX equipped with a water-cooled 40 W infrared semiconductor laser available from Creo Inc., under the following conditions: resolution: 175 lpi; rotational number of outer drum: 150 rpm; output: 8 W) and cured image-recording layer in an alkaline developer (28° C.); connecting the aluminum substrate to a leading wire, providing a usual electrode as the counterpart electrode and applying an electric voltage between these electrodes. After the application of the electric voltage, the developer penetrates into the interface between the substrate and the image-recording layer and thus the electrostatic capacity is changed with the elapse of time.

The desired developer-penetration rate can be determined according to the following equation on the basis of the time (s) required till the electrostatic capacity causes a change and the thickness (μm) of the image-recording layer. In this respect, it can be judged as follows: the lower the penetration rate, the lower the penetration ability of the developer into the layer.

Penetration rate of developer (into un-exposed area)= [(Thickness (μm) of the image-recording layer)/(Time (s) required the electrostatic capacity change to reach a constant level)]

To make clear the correspondency between the practical quality and the theoretical one, tests were conducted for examining the printing durability of the resulting plate materials (see the section concerning the evaluation of printing durability).

The image-recording layer of the lithographic printing plate precursor used in the present invention should have the following physical properties: the developing rate of the un-exposed portion with respect to an alkaline developer of preferably not less than 80 nm/sec, more preferably 80 to 400 nm/sec and further preferably 90 to 200 nm/sec. In addition, the penetration rate of alkaline developer observed for exposed areas is preferably not more than 100 nF/sec, more preferably not more than 90 nF/sec and further preferably not more than 80 nF/sec.

(Evaluation of Developing Ability (or Developing Properties))

The developing ability of the practical non-image area was observed by developing the same at 30° C. for 12 seconds using LP-1310HII available from Fuji Photo Film Co., Ltd.

(Evaluation of Printing Durability)

The resulting lithographic printing plate precursor was imagewise exposed to light using Trendsetter 3244VX equipped with a water-cooled 40 W infrared light-emitting semiconductor laser available from Creo Inc., under the conditions of: resolution: 175 lpi and rotational number of outer drum: 150 rpm, while changing the output by 0.15 each at a time, as expressed in terms of log E, within the range of from 0 to 8 W. In this connection, the exposure was carried out at 25° C. and 50% RH. After the exposure to light rays, the exposed precursor was washed with tap water to remove the protective layer and then the precursor was developed at 30° C. for 12 seconds using LP-1310HII available from Fuji Photo Film Co., Ltd. A 1:1 water diluted solution of FP-2W available from Fuji Photo Film Co., Ltd. was used as a finisher.

The resulting lithographic printing plate was fitted to a printing press LITHRON 26 available from Komori Corporation to thus obtain printed matters and the number of possible printed matters was used as an indication for the printing durability.

(pH Reduction Due to Carbon Dioxide in Air)

Each developer was charged to LP-1310HII available from Fuji Photo Film Co., Ltd. and any pH change was determined after allowing the plate material to stand for one day.

(Evaluation of pH Latitude of Developer at Sensitivity Change of ±10%)

The resulting lithographic printing plate precursor was imagewise exposed to light using Trendsetter 3244VX equipped with a water-cooled 40 W infrared light-emitting semiconductor laser available from Creo Inc., under the conditions of: resolution: 175 lpi and rotational number of outer drum: 150 rpm, while changing the output by 0.15 each at a time, as expressed in terms of log E, within the range of from 0 to 8 W. In this connection, the exposure was carried out at 25° C. and 50% RH. After the exposure to light rays, the exposed precursor was washed with tap water to remove the protective layer and then the precursor was developed at 30° C. for 12 seconds using each of the foregoing developers of Examples and Comparative Examples. A 1:1 water diluted solution of FP-2W available from Fuji Photo Film Co., Ltd. was used as a finisher.

The density observed for the image area on the lithographic printing plate obtained through the development was determined using Macbeth's reflection densitometer and, more specifically, the cyan density thereof was determined using a red filter fitted to the densitometer. The reciprocal number of the exposure required for achieving the density thus determined of 0.8 is used as an indication for the sensitivity.

Then potassium hydroxide was added to the developer for the purpose of changing the pH value of the developer. Thus, the pH value of the developer was once increased, followed by intentional blowing of carbon dioxide gas into the developer for the reduction of the pH thereof and the determination of the magnitude of the pH change required for making the sensitivity cause a change of ±10% around the central value thereof, which was defined to be the pH latitude of the developer. In this respect, the quality of the printing plate-forming material is more hardly influenced by a pH variation of the developer due to any external factor, the more the pH latitude value is increased.

TABLE 2

| Dev. No. | Rate of Dev.[1] (μm/sec) | Developing Prop. | Rate of Penet.[2] (nF/sec) | Printing Durability (No. of sheets) | pH Latitude[3] | pH Change (24 hrs) |
|---|---|---|---|---|---|---|
| 1 | 120 | ○ | 55 | 110,000 | ±0.4 | 0.05 |
| 2 | 130 | ○ | 60 | 110,000 | ±0.4 | 0.05 |
| 3 | 160 | ○ | 65 | 100,000 | ±0.5 | 0.05 |
| 4 | 160 | ○ | 65 | 110,000 | ±0.4 | 0.05 |
| 5 | 110 | ○ | 50 | 120,000 | ±0.3 | 0.05 |
| 6 | 160 | ○ | 70 | 100,000 | ±0.4 | 0.05 |
| 7 | 120 | ○ | 55 | 110,000 | ±0.3 | 0.05 |
| 8 | 100 | ○ | 60 | 110,000 | ±0.4 | 0.05 |
| 9 | 170 | ○ | 55 | 110,000 | ±0.4 | 0.05 |
| 10 | 95 | ○ | 65 | 110,000 | ±0.4 | 0.05 |
| 11 | 145 | ○ | 85 | 100,000 | ±0.4 | 0.05 |
| 12 | 170 | ○ | 55 | 110,000 | ±0.4 | 0.05 |
| 13 | 110 | ○ | 55 | 110,000 | ±0.4 | 0.05 |
| 14* | 80 | Residual coating | 50 | 110,000 | — | 0.1 |
| 15* | 75 | Residual coating | 50 | 110,000 | — | 0.05 |
| 16* | 85 | Residual coating | 55 | 90,000 | — | 0.05 |
| 17* | 110 | ○ | 85 | 85,000 | ±0.2 | 0.05 |
| 18* | 75 | Residual coating | 85 | 90,000 | — | 0.05 |
| 19* | 145 | ○ | 175 | 85,000 | ±0.1 | 0.4 |
| 20* | 10 | Residual coating | 40 | 120,000 | ±0.1 | 0.6 |

*Comparative Developer;
○: There was not observed any residual coating.
[1]The developing rate of non-image areas;
[2]the rate of penetration of the developer into image areas;
[3]the pH latitude of the developer observed when the plate-making material undergoes a sensitivity change of ±10%.

As will be clear from the data listed in the foregoing Table, good results are obtained with respect to the both developing properties and printing durability when using the developer of the present invention. In addition, the developer of the invention shows a quite small pH change on the order of 0.05 after allowing to stand over one day (24 hours) and the pH latitude thereof observed when the plate-making material undergoes a sensitivity change of ±10% is relatively high. On the other hand, the comparative developers free of any added silicate (Comparative Developers 14 and 15) are accompanied by residual coating and the pH change after 24 hours is sometimes increased (Comparative Developer 14). Moreover, if the ratio of the total molar concentration of the carbonate and the bicarbonate to the total molar concentration of the $SiO_2$ component present in the alkali silicate and the sum of these total molar concentrations are beyond the scopes specified in the present invention, the printing durability of the resulting printing plate is reduced, there is observed the generation of residual coating (Comparative Developers 16 and 18) and the pH latitude is found to be reduced (Comparative Developer 17).

As has been described above in detail, the developer and image-forming method according to the present invention can ensure sufficient developing properties or a satisfactory developing ability at a low pH wherein the image-forming material is hardly damaged. Accordingly, they permit the simultaneous achievement of good printing durability and a good developing ability of an image-forming material. Further, the developing activity of the developer is not hardly reduced due to the action of carbon dioxide and therefore, it does not suffer from a problem originated from the scum formed during development.

What is claimed is:

1. A developer comprising at least one carbonate selected from the group consisting of sodium carbonate, potassium carbonate and ammonium carbonate, at least one hydrogen carbonate selected from the group consisting of sodium hydrogen carbonate, potassium hydrogen carbonate and ammonium hydrogen carbonate and at least one alkali silicate selected from the group consisting of sodium silicate, potassium silicate, lithium silicate and ammonium silicate, wherein the amount of the carbonate is from 0.06 to 0.15 mol/l, the amount of bicarbonate is from 0.02 to 0.4 mol/l, the amount of silicate is from 15 to 80 g/l, the ratio of the total molar concentration "a" of the carbonate and the hydrogen carbonate to the molar concentration "b" of the $SiO_2$ component present in the alkali silicate: "a/b" ranges from 1:0.3 to 1:2, the total molar concentration of "a" and "b": "a+b" ranges from 0.1 to 2 mole/L, and the pH value thereof ranges from 9.1 to 10.9, said developer further comprising at least one surfactant selected from the group consisting of anionic surfactants and nonionic surfactants in an amount ranging from 1 to 10% by mass, said anionic surfactant being represented by the following general formula (I-B):

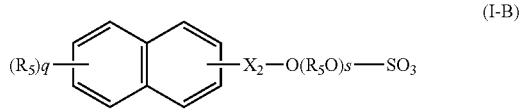

(I-B)

wherein $R_5$ represents a linear or branched alkylene group having 1 to 5 carbon atoms; $R_6$ represents a linear or branched alkyl group having 1 to 20 carbon atoms; q represents 0, 1 or 2; $X_2$ represents a single bond or an alkylene group having 1 to 10 carbon atoms; s is an integer ranging from 1 to 100, provided that if s is not less than 2, $R_5$ may be selected from at least two kinds of groups, and said nonionic surfactant being selected from the group consisting of nonionic aromatic ether type surfactants represented by the following formula (1):

$$X-Y-O-(A)_n-(B)_m-H \qquad (1)$$

wherein X represents a substituted or unsubstituted aromatic group; Y represents a single bond or an alkylene group having 1 to 10 carbon atoms; A and B represent groups different from one another and each represents either $-CH_2CH_2O-$ or $-CH_2CH(CH_3)O-$; m and n are 0 or integers ranging from 1 to 100, respectively, provided that n and m cannot simultaneously represent 0 and that when n or m is 0, n and m cannot represent 1, wherein the developer has an electrical conductivity of from 34 to 82 mS at 25° C. and does not exhibit condensation of silicate.

2. The developer of claim 1, further comprising at least one compound selected from the group consisting of alkali metal salts of organic acids and alkali metal salts of inorganic acids.

3. The developer of claim 1, further comprising an anti-foaming agent.

4. The developer of claim 3, wherein the anti-foaming agent is at least one member selected from the group consisting of acetylene alcohols and acetylene glycols.

5. An image-forming method comprising the steps of imagewise exposing a negative-working image-forming material which comprises a substrate provided thereon with an image-recording layer comprising an infrared light absorber, a polymerization initiator, an ethylenically unsaturated bond-containing monomer and a polymer binder, and then developing the imagewise exposed image-forming material with the developer as set forth in claim 1.

6. The method of claim 5, further comprising at least one compound selected from the group consisting of alkali metal salts of organic acids and alkali metal salts of inorganic acids.

7. The method of claim 5, further comprising an anti-foaming agent.

8. The method of claim 7, wherein the anti-foaming agent is at least one member selected from the group consisting of acetylene alcohols and acetylene glycols.

9. The developer of claim 1, wherein the surfactant is an anionic surfactant.

* * * * *